US011175321B1

(12) United States Patent
Ueda

(10) Patent No.: US 11,175,321 B1
(45) Date of Patent: Nov. 16, 2021

(54) SEMICONDUCTOR DEVICE

(71) Applicant: RENESAS ELECTRONICS CORPORATION, Tokyo (JP)

(72) Inventor: Takehiro Ueda, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/923,662

(22) Filed: Jul. 8, 2020

(51) Int. Cl.
*G01R 19/32* (2006.01)
*H02M 3/155* (2006.01)
*H02M 1/00* (2006.01)
*H01L 29/78* (2006.01)

(52) U.S. Cl.
CPC .......... *G01R 19/32* (2013.01); *H01L 29/7815* (2013.01); *H02M 1/00* (2013.01); *H02M 3/155* (2013.01); *H02M 1/0009* (2021.05)

(58) Field of Classification Search
CPC ...... G01R 19/32; H01L 29/7815; H02M 1/00; H02M 3/155; H02M 1/0009
See application file for complete search history.

(56) References Cited

U.S. PATENT DOCUMENTS

| 8,633,550 | B2 | 1/2014 | Uno et al. | |
|---|---|---|---|---|
| 2018/0366346 | A1* | 12/2018 | Mori | H01L 29/8083 |
| 2020/0328274 | A1* | 10/2020 | Hoshi | H01L 29/0696 |
| 2021/0036700 | A1* | 2/2021 | Ishimatsu | H03K 17/165 |
| 2021/0134771 | A1* | 5/2021 | Betsui | H02M 1/14 |

FOREIGN PATENT DOCUMENTS

JP    5706251 B2    4/2015

* cited by examiner

*Primary Examiner* — Adolf D Berhane
(74) *Attorney, Agent, or Firm* — McDermott Will & Emery LLP

(57) ABSTRACT

Semiconductor device includes an element region in which the semiconductor element is provided, a semiconductor substrate including an outer peripheral region surrounding the element region, a plurality of semiconductor elements provided in an array-like in the element region. The element region includes a main circuit region in which the main circuit of semiconductor device is formed, and a sense circuit region in which a sense circuit for measuring the drain current flowing through the semiconductor element of the main circuit region is formed. Semiconductor element of the sense circuit region is surrounded by other semiconductor elements. Sense circuit region is covered with a main circuit source electrode which is connected to the semiconductor element of the main circuit region.

10 Claims, 41 Drawing Sheets

SEMICONDUCTOR DEVICE

BACKGROUND

The present invention relates to a semiconductor device.

There is a semiconductor device provided a current detecting circuit for detecting the current flowing through the circuit.

There is disclosed technique listed below.
[Patent Document 1] Japanese Patent No. 5706251

Patent Document 1 discloses semiconductor device to improve the reliability suppresses a decrease in the current detecting sensitivity, by arranging the current detecting element in the center of the chip, even if cracks occur at the chip end.

SUMMARY

In semiconductor device with current detecting circuit, it is desirable to effectively utilize the chip area.

Other objects and novel features will become apparent from the description of this specification and the accompanying drawings.

Semiconductor device of an embodiment includes an element region in which the semiconductor element is provided, a semiconductor substrate including an outer peripheral region surrounding the element region, a plurality of semiconductor elements provided in an array in the element region. The element region includes a main circuit region in which the main circuit of semiconductor device is formed, and a sense circuit region in which a sense circuit for measuring the drain current flowing through the semiconductor element of the main circuit region is formed. Semiconductor element in the sense circuit region is surrounded by other semiconductor elements. Sense circuit region is covered with a main circuit source electrode which is connected to the semiconductor element of the main circuit region.

DETAILED DESCRIPTION

Figure 1:
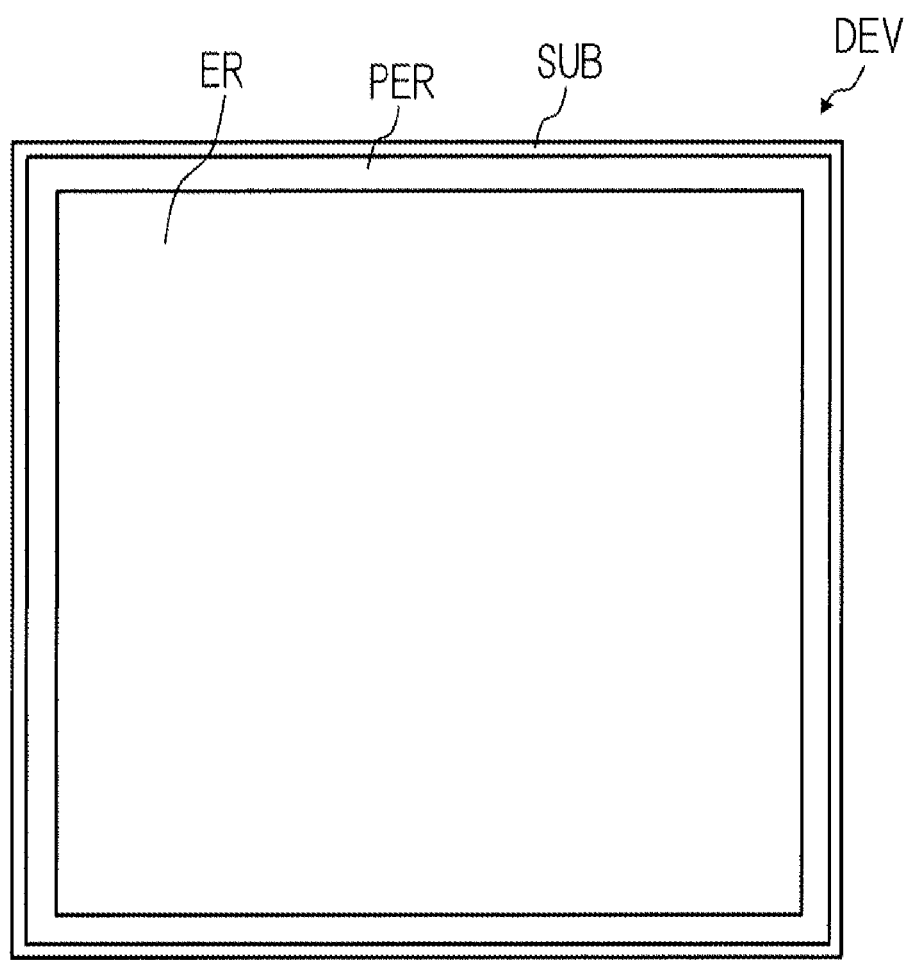
FIG. 1 is a plan view illustrating an outline of a semiconductor device according to first embodiment of the present invention.

Hereinafter, embodiments of the present invention are described in detail with reference to the drawings. In all the figures for explaining the embodiment, the same parts are denoted by the same reference numerals in principle, and a description of the repetition thereof will be omitted.

First Embodiment (Structure of Semiconductor Device)

FIG. 1 is a plan view illustrating an outline of a semiconductor device according to first embodiment of the present invention. Semiconductor device DEV according to present embodiment are not limited to specific applications, for example, power semiconductors for power supply, can be mounted on various semiconductors such as arithmetic semiconductors and memory semiconductors.

Semiconductor device DEV, as shown in FIG. 1, has an element region ER and an outer peripheral region PER surrounding the element region ER. The element region ER is a region where a plurality of semiconductor elements such as MOSFET are provided. The element region ER, for example, a plurality of semiconductor elements are arranged in an array. In the following, the semiconductor device will be described with reference to the cases where mainly a vertical MOSFET of the trench gate structure.

The outer peripheral region PER is a region surrounding the outer periphery of the element region ER in a plan view. The outer peripheral region PER, for example, the main circuit source Kelvin electrode MSS shown in FIG. 2 to be described later, the sense circuit source electrode SSF, the sense circuit source Kelvin electrode SSS, and the gate electrode GP and the like are provided. Further, semiconductor device DEV, the electrodes of the outer peripheral region PER, terminals for connecting the outside may be provided.

Figure 2:
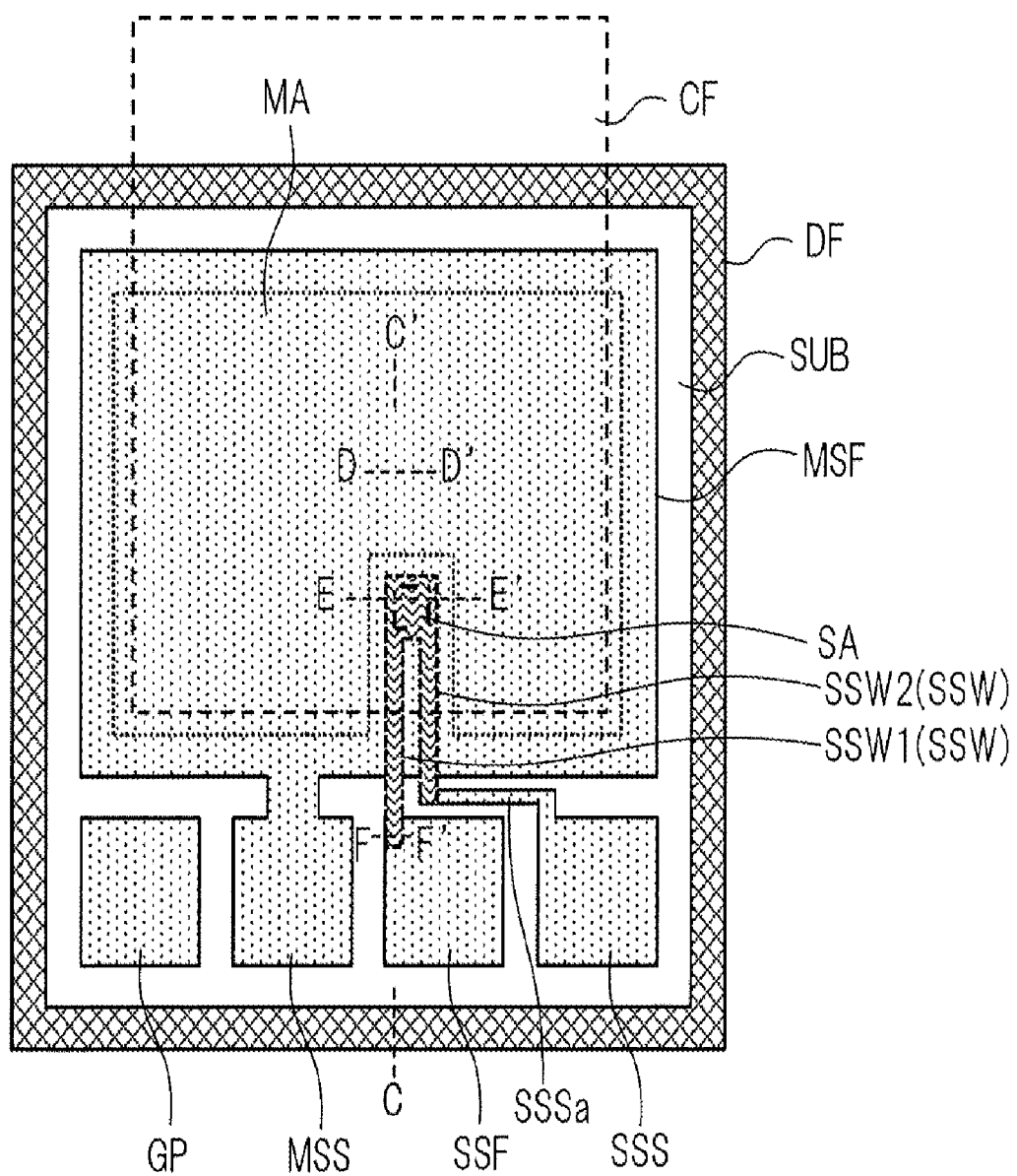
FIG. 2 is a plan view schematically illustrating an exemplary configuration of a semiconductor device according to first embodiment of the present invention.
Figure 3:
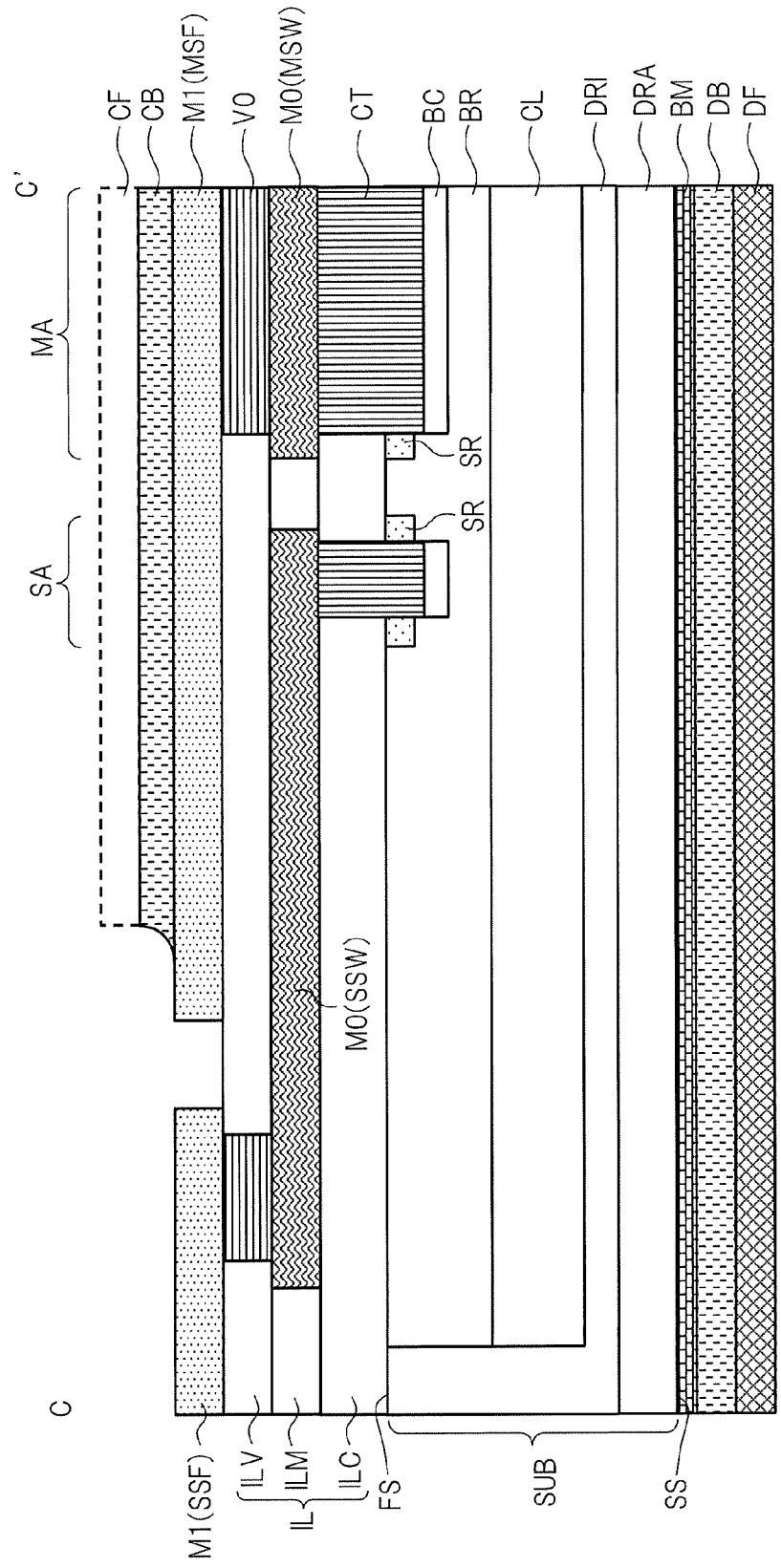
FIG. 3 is C-C' sectional view of FIG. 2.
Figure 4:
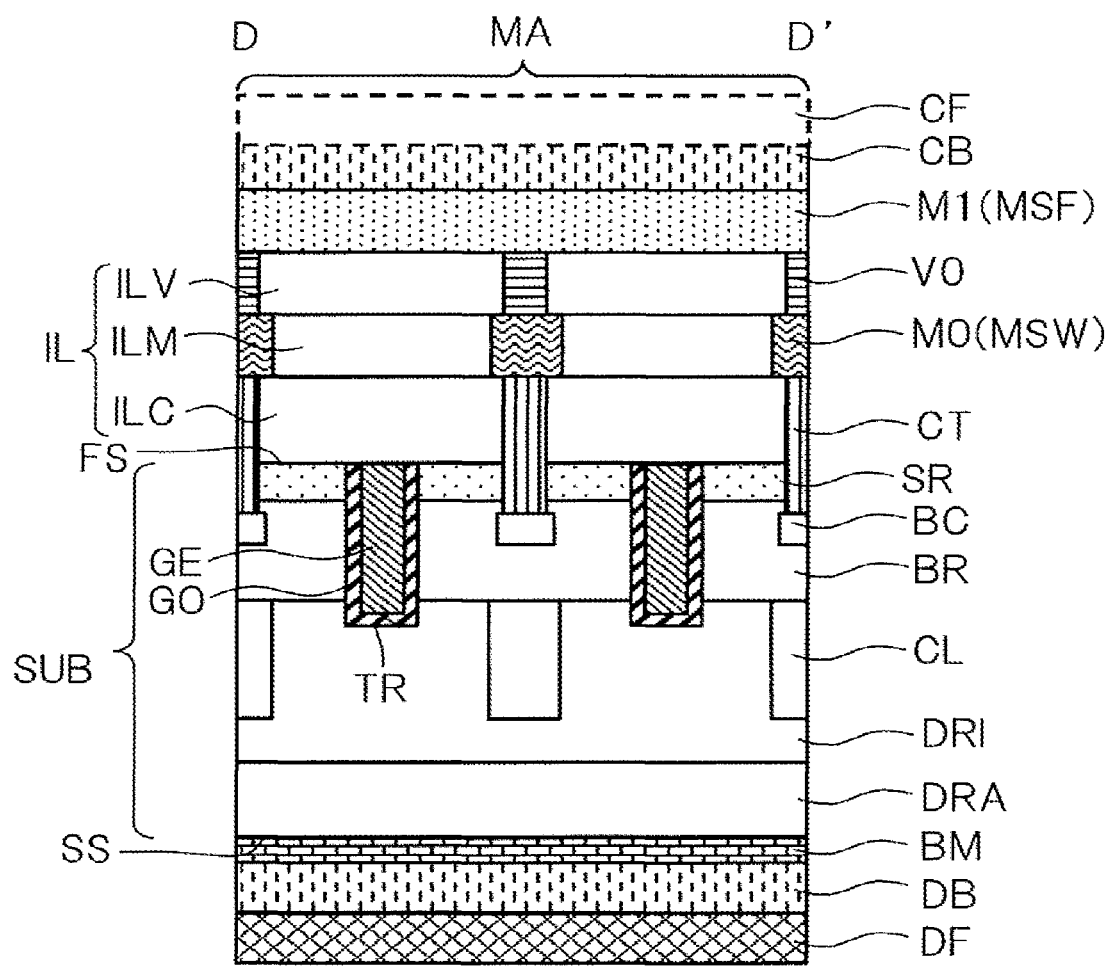
FIG. 4 is D-D' sectional view of FIG. 2.
Figure 5:
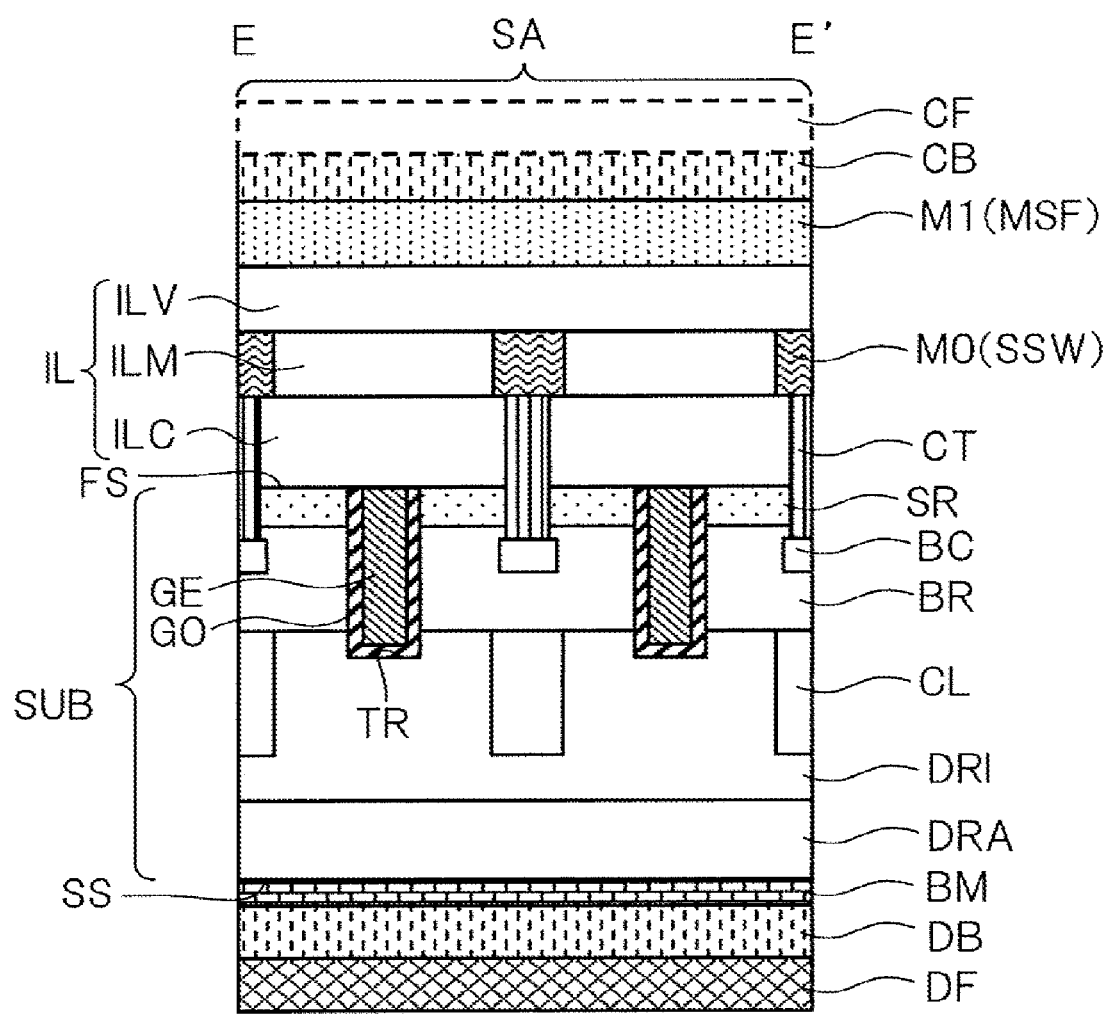
FIG. 5 is E-E' sectional view of FIG. 2.
Figure 6:
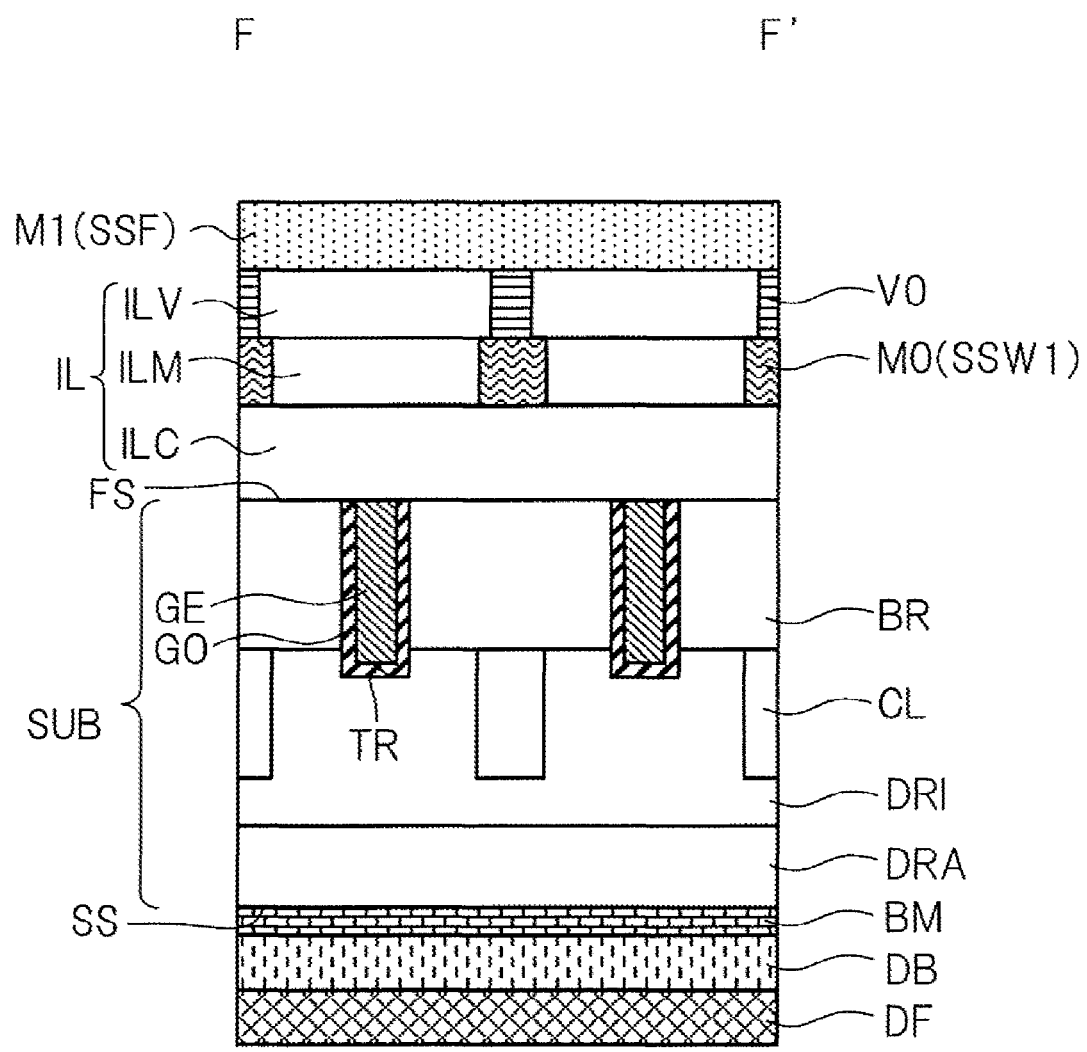
FIG. 6 is F-F' sectional view of FIG. 2.

FIG. 2 is a plan view schematically illustrating an exemplary configuration of a semiconductor device according to first embodiment of the present invention. FIG. 3 is C-C' sectional view of FIG. 2. FIG. 4 is D-D' sectional view of FIG. 2. FIG. 5 is E-E' sectional view of FIG. 2. FIG. 6 is F-F' sectional view of FIG. 2. In FIGS. 2 to 6, semiconductor device DEV with the die frame DF connected using the die bonding material DB is shown. Incidentally, in the subsequent drawings, there is a case where semiconductor device fixed to the die frame is shown.

Semiconductor device DEV is equipped with semiconductor substrate SUB as shown in FIGS. 2 to 6. Semiconductor substrate SUB, for example, single crystal silicon (Si) is used. However, the material used in semiconductor substrate SUB is not limited thereto, for example, silicon carbide (SiC) or the like may be used.

As shown in FIG. 3, semiconductor substrate SUB has a first surface FS and a second surface SS. The second surface SS is a surface opposite to the first surface FS. Semiconductor device DEV is connected to the die frame DF at the second surface SS side of semiconductor substrate SUB. On the other hand, the first surface FS side of semiconductor substrate SUB is connected to the clip frame CF using a clip bonding material CB.

As shown in FIG. 2 or the like, the element region ER includes a main circuit region MA in which a main circuit for realizing the main function of semiconductor device is formed, and a sense circuit region SA in which a sense circuit for measuring the drain current flowing through the semiconductor element of the main circuit region MA is formed. In the following, the semiconductor element of the main circuit region MA may be referred to as a main MOS, it may be referred to as a semiconductor element of the sense circuit region SA as a sense MOS.

Semiconductor device DEV described herein measures the drain current of the sense MOS and the drain current of the main MOS based on, for example, the voltage of the main circuit source Kelvin electrode MSS and the voltage of the sense circuit source Kelvin electrode SSS.

In the semiconductor element, the current flowing in from the drain side drain current, the current flowing out from the source side is generally referred to as a source current. However, in present embodiment, since the |drain current|=|source current|, if there is no need to pay attention to the direction of the current, it may be collectively referred to as a drain current.

Semiconductor substrate SUB of the element region ER, a drain region DRA, a drift region DRI, a base region BR, and the source region SR are formed. Further, semiconductor substrate SUB of the element region ER, a column region CL, and the base contact region BC may be formed.

The drain region DRA, the drift region DRI and the source region SR is a first conductivity type (e.g., n-type). The base region BR, the base contact region BC and the column region CL are of a second conductivity type different from the first conductivity type. The second conductivity type is a second conductivity type (e.g., p-type) having a characteristic opposite to the first conductivity type.

A drain region DRA is provided on the second surface SS side of semiconductor substrate SUB. The drift region DRI is provided on the first surface FS side of the drain region DRA in semiconductor substrate SUB. Specifically, the drift region DRI is provided so as to contact the surface of the first surface FS side of the drain region DRA before the formation of the column region CL and the base region BR to be described later.

A base region BR, in semiconductor substrate SUB, is provided on the first surface FS side of the drift region DRI. Specifically, the base region BR may be provided so as to contact the surface of the first surface FS side of the drift region DRI, or may be provided so as to contact the drift region DRI through the column region CL.

Source region SR, in semiconductor substrate SUB, is provided on the first surface FS side of the base region BR. Specifically, the source region SR is provided in the base region BR so as to contact the first surface FS of semiconductor substrate SUB. The source region SR is provided so as to sandwich the base region BR between the drift region DRI. From another point of view, the base region BR has a portion sandwiched by the source region SR and the drift region DRI.

Base contact region BC is provided in the base region BR. Specifically, the base contact region BC is provided in contact with the lower end of the contact CT. Column region CL is provided extending from the base region BR toward the second surface SS.

The impurity concentration of the drift region DRI is preferable lower than the respective impurity concentrations of the source region SR and the drain region DRA. This allows the withstand voltage of semiconductor device DEV to be secured.

When the column region CL is formed, the depletion layer extends laterally from the column region CL toward the drift region DRI. Therefore, the impurity concentration in the drift region DRI, even if higher than the respective impurity concentrations in the source region SR and the drain region DRA, it is possible to ensure the withstand voltage. Thus, while ensuring the withstand voltage, it is possible to reduce the on-resistance.

Semiconductor device DEV includes, for example, the gate electrode GEs shown in FIGS. 4 to 6. The gate electrode GE is made of, for example, polycrystalline silicon (Si) doped with impurities. The polycrystalline Si doped impurity is preferably an element that serves as a donor. Specifically, the impurity doped into polycrystalline Si, for example phosphorus (P), an element of Group V such as arsenic (As). That is, the polycrystalline silicon used in the gate electrode GE preferably has an n-type conductivity type. However, the impurity doped in polycrystalline silicon used in the gate electrode GE may be a group III element such as boron (B).

In the semiconductor substrate SUB, grooves TRs are formed. The grooves TRs extend from the first surface FS of semiconductor substrate SUB toward the second surface SS. Specifically, the grooves TRs extend through the source region SR and the base region BR to reach the drift region DRI. The groove TR is filled with the gate electrode GE. Between the gate electrode GE filled in the groove TR and the bottom and side walls of the groove TR, the gate insulating film GO is formed. The gate insulating film GO is composed of, for example, silicone diode (SiO2).

Configuration of the gate electrode GE is not limited to the above configuration. The gate electrode GE may be formed so as to face while insulating the portion of the base region BR sandwiched by the source region SR and the drift region DRI.

For example, in MOSFET of the planar gate type, it is not necessary to form a groove TR on the first surface FS of semiconductor substrate SUB. Instead, in the planar gate type MOSFET, on the first surface FS of semiconductor substrate SUB, on the portion of the base region BR which is sandwiched by the source region SR and the drift region DRI, the gate insulating film GO is formed, and the gate electrode GE is formed on the gate insulating film GO. Thus, the gate electrode GE, the portion of the base region BR which is sandwiched by the source region SR and the drift region DRI, it is possible to face while being insulated.

In semiconductor device DEV of the element regions ER, the contacts CT, the lower layer wirings M0, the lower layer vias V0, and the upper layer wirings M1 are stacked. In these each layer, the interlayer insulating film IL is provided. The interlayer insulating film IL includes a contact interlayer insulating film ILC, the lower wiring interlayer insulating film ILM, the lower via interlayer insulating film ILV.

First, on the first surface FS of semiconductor substrate SUB, the contact CT and the contact interlayer insulating film ILC is provided. The contact interlayer insulating film ILC is provided so that the upper end is aligned with the contact CT.

On the layer including the contact CT and the contact interlayer insulating film ILC, a lower layer wiring M0 and a lower wiring interlayer insulating film ILM are provided. One end of the lower layer wiring M0 is connected to the upper end of the contact CT. The contact CT is provided extending from the base region BR as shown in FIG. 3 or the like. Therefore, the contact CT functions as a conductive layer that electrically connects the base region BR and the lower layer wiring M0 in layers different from each other. The lower wiring interlayer insulating film ILM is provided so that the upper end thereof is aligned with the lower layer wiring M0.

On the layer including the lower layer wiring M0 and the lower wiring interlayer insulating film ILM, a lower layer via V0 and a lower via interlayer insulating film ILV are provided. The other end of the lower layer wiring M0 is connected to the lower end of the lower layer via V0. The lower via interlayer insulating film ILV is provided so that the upper end thereof is aligned with the lower layer via V0.

An upper layer wiring M1 is provided on the layer including the lower layer via V0 and the lower via interlayer insulating film ILV. One end of the upper layer wiring M1 is connected to the upper end of the lower layer via V0. Therefore, the lower layer via V0 functions as a conductive layer that electrically connects the lower layer wiring M0 and the upper layer wiring M1 in different layers from each other.

The lower layer wiring M0 includes a main circuit source wiring MSW for a semiconductor element (main MOS) in the main circuit region MA and a sense circuit source wiring SSW for a semiconductor element (sense MOS) in the sense circuit region SA. The upper layer wiring M1 includes a main circuit source wiring MSW.

The main circuit source electrode MSF is provided so as to cover the main circuit region MA or the element region ER including the main circuit region MA, as shown in FIG. 2. Then, the main circuit source electrode MSF is connected to the main circuit source Kelvin electrode MSS provided in the same layer as the upper layer wiring in the outer peripheral region PER, as shown in FIG. 2.

The sense circuit source wiring SSW is a wiring for flowing a drain current of the semiconductor element of the sense circuit region SA. The sense circuit source wiring SSW, as shown in FIG. 2, is drawn from the element region ER to the outer peripheral region PER. That is, the sense circuit source wiring SSW extends from the element region ER to the outer peripheral region PER. The sense circuit source wiring SSW for the sense circuit includes two types of sense circuit source wirings SSW1 and SSW2, as shown in FIG. 2. The sense circuit source wiring SSW1 is connected to the sense circuit source electrode SSF through the lower layer via V0 in the outer peripheral region PER. In FIG. 2, although only one sense circuit source wiring SSW1, in practice, a plurality of sense circuit source wiring SSW1 may be provided On the other hand, the sense circuit source wiring SSW2 is connected to the sense circuit source Kelvin electrode SSS. The sense circuit source wiring SSW2 is connected to the wiring SSSa through the lower layer via V0 in the outer peripheral region PER, and is connected to the sense circuit source Kelvin electrode SSS through the wiring SSSa. The sense circuit source wiring SSW2 is a wiring for monitoring the source potential of the semiconductor device of the sense circuit region SA. The sense circuit source electrode SSF, the sense circuit source Kelvin electrode SSS, and the wiring SSSa are provided in the same layer as the upper layer wiring M1.

Thus, by providing the main circuit source electrode MSF and the sense circuit source wiring SSW (SSW1, SSW2) in different layers from each other, it is possible to provide the main circuit source electrode MSF in the entire area of the element region ER.

(Method of Manufacturing Semiconductor Device)

Figure 7:
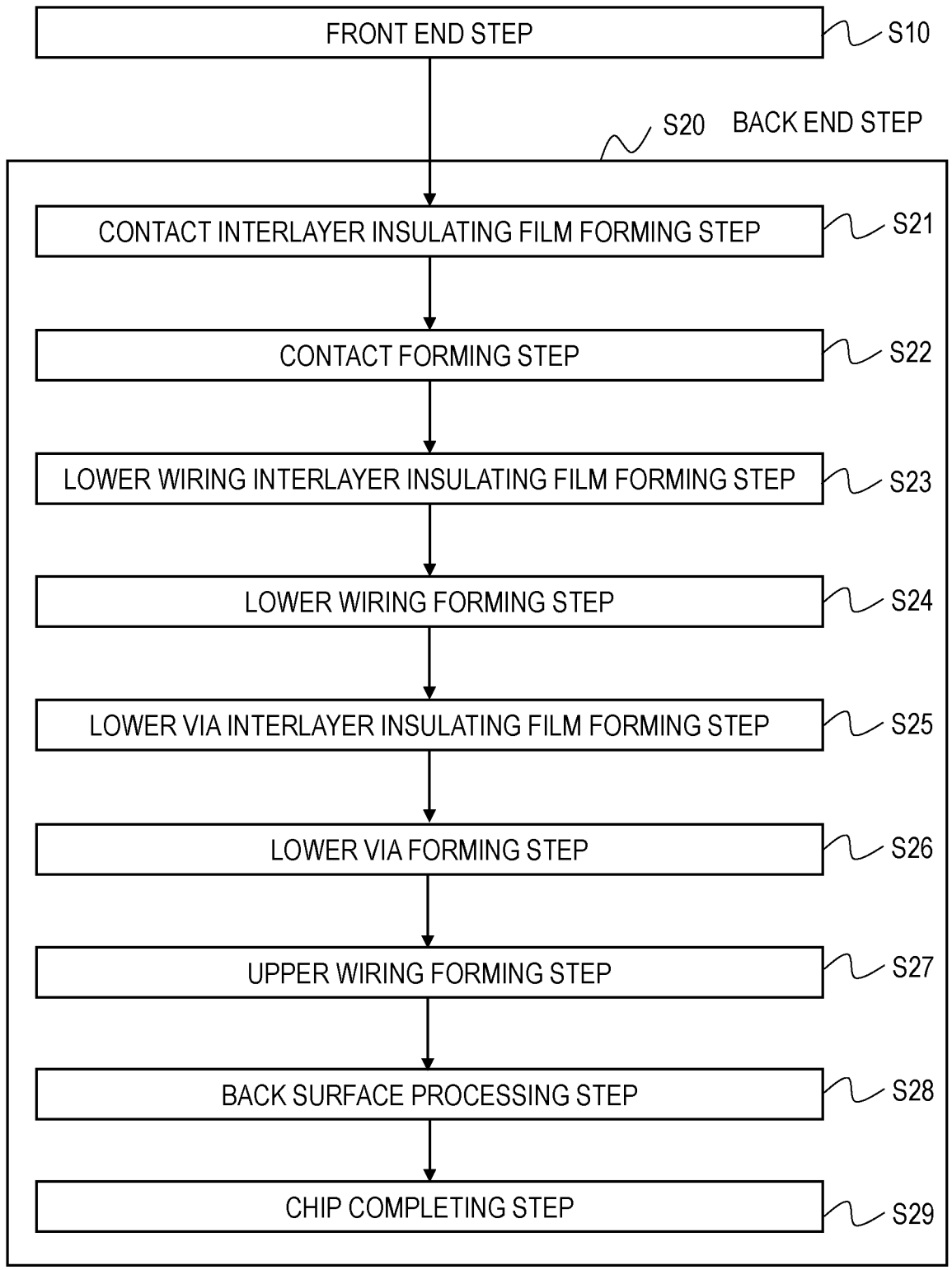
FIG. 7 is a flowchart illustrating an exemplary manufacturing method of semiconductor device according to first embodiment of the present invention.

Next, manufacturing method of semiconductor device will be described. FIG. 7 is a flowchart illustrating an exemplary manufacturing method of semiconductor device according to first embodiment of the present invention. The flow of FIG. 7 includes a front end step S10 and a back end step S20.

Figure 8:
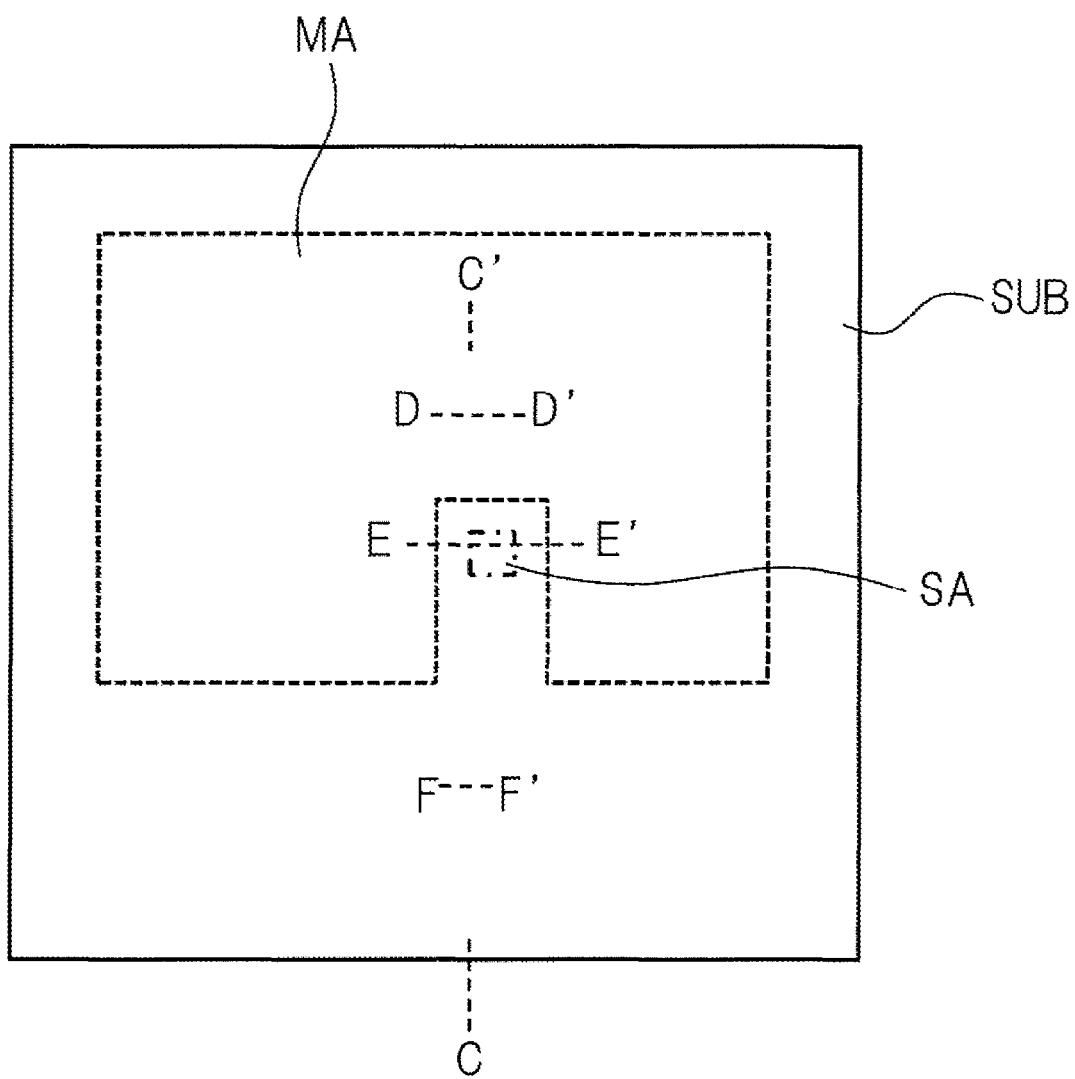
FIG. 8 is a plan view illustrating an exemplary semiconductor device at the end of the front end process.
Figure 9:
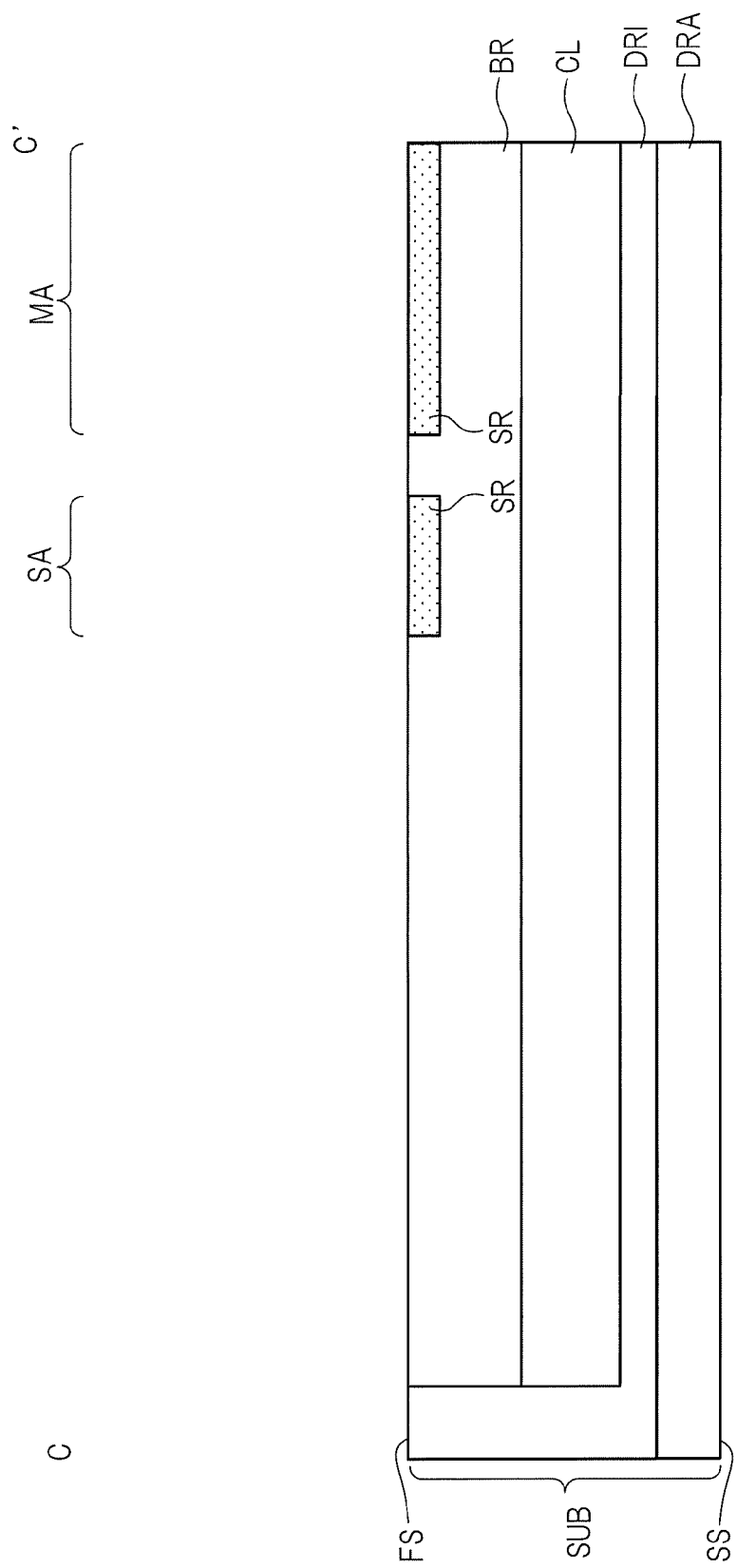
FIG. 9 is C-C' sectional view of FIG. 8.
Figure 10:
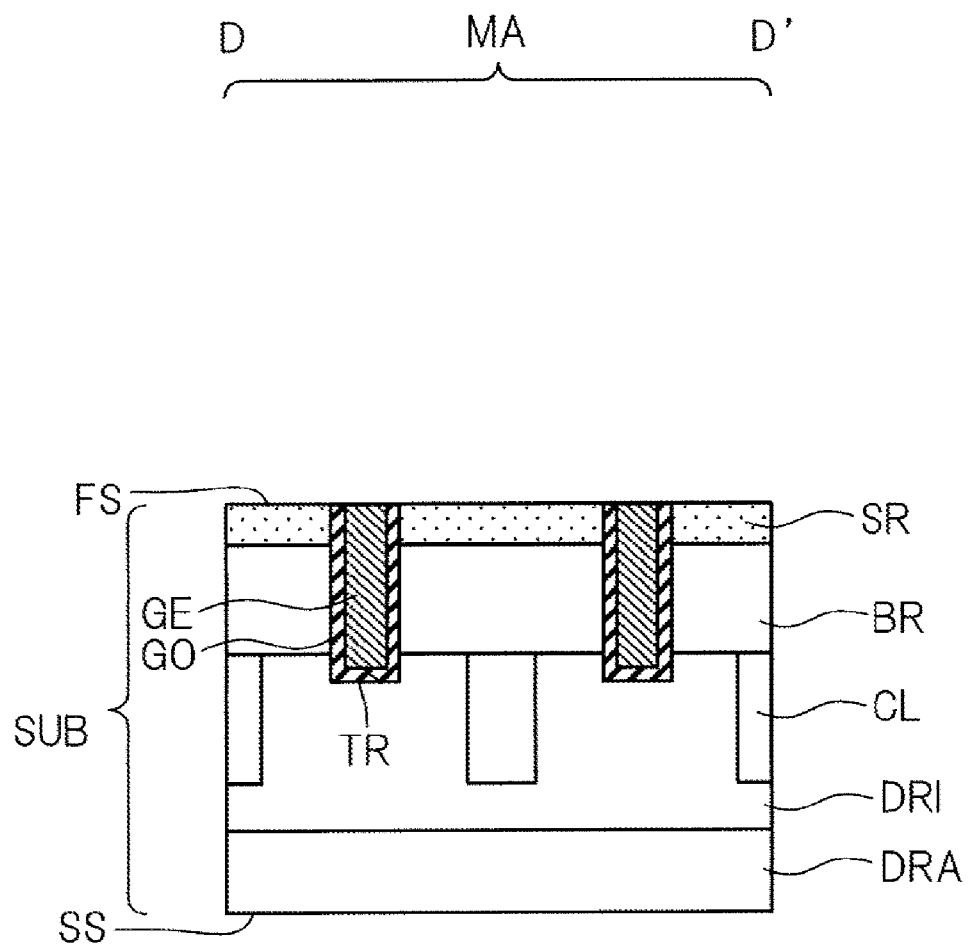
FIG. 10 is D-D' sectional view of FIG. 8.
Figure 11:
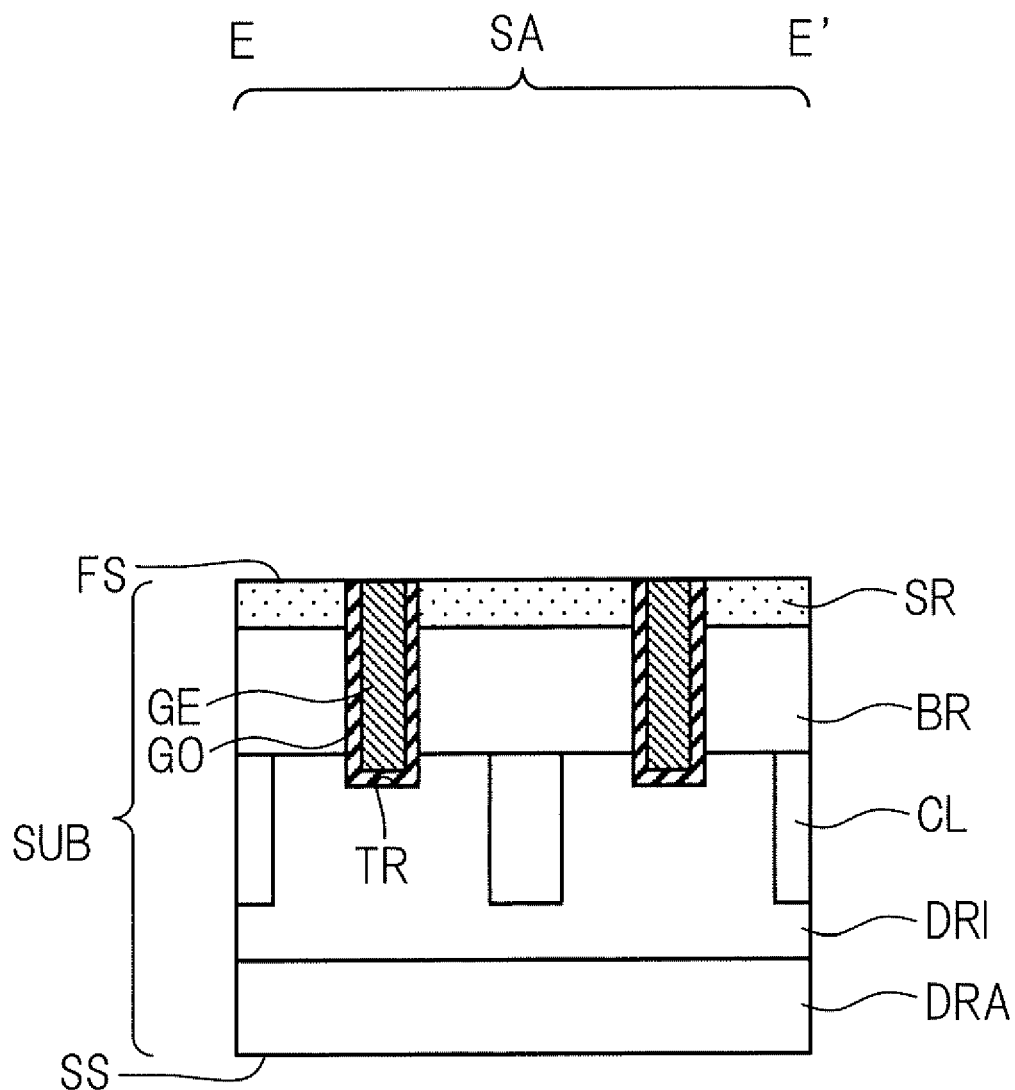
FIG. 11 is E-E' sectional view of FIG. 8.
Figure 12:
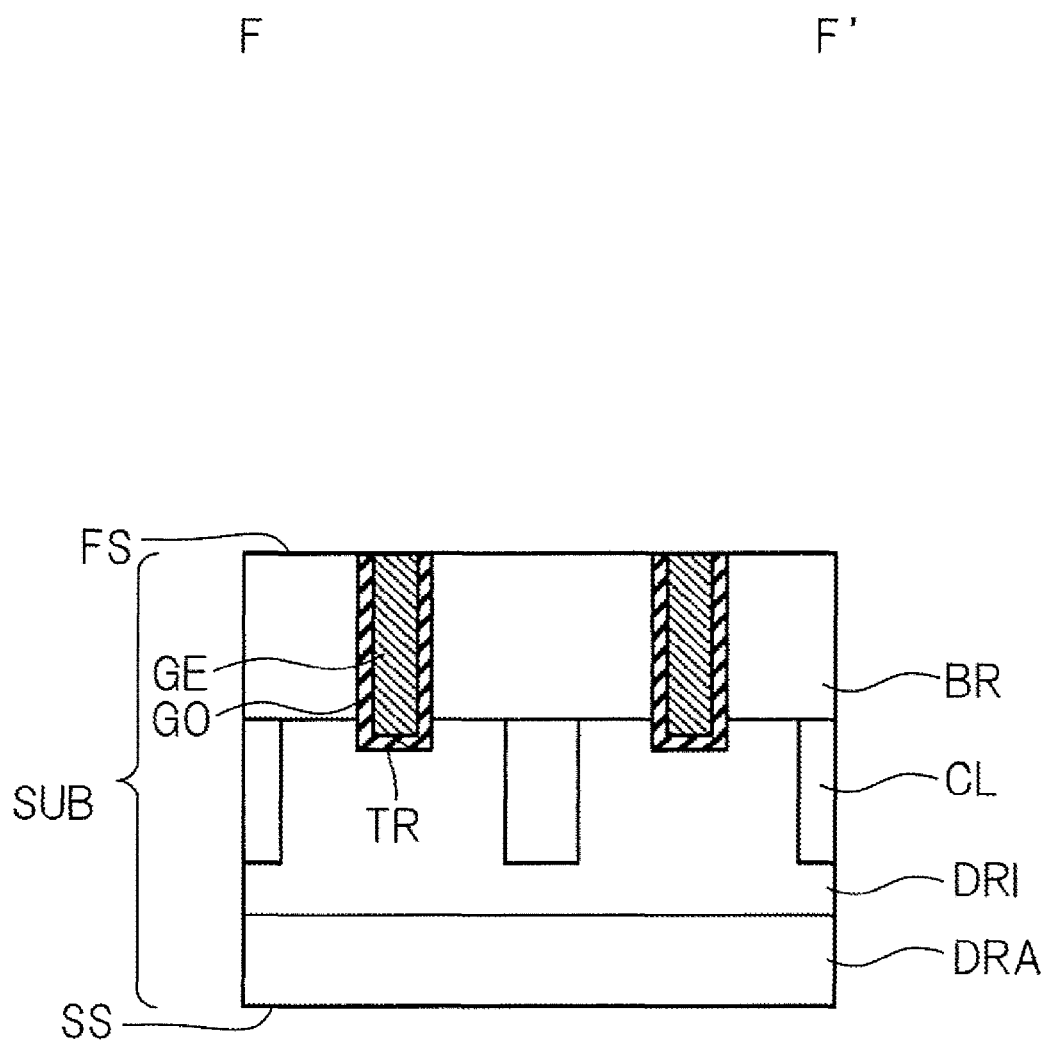
FIG. 12 is F-F' sectional view of FIG. 8.

FIG. 8 is a plan view illustrating an exemplary semiconductor device at the end of the front end process. FIG. 9 is C-C' sectional view of FIG. 8. FIG. 10 is D-D' sectional view of FIG. 8. FIG. 11 is E-E' sectional view of FIG. 8. FIG. 12 is F-F' sectional view of FIG. 8. FIGS. 8 to 12 correspond to FIGS. 2 to 6, respectively.

As shown in FIGS. 9 to 11, in the front end step S10, a drain region DRA, a drift region DRI, a base region BR, a source region SR, a column region CL, a trench TR, gate electrodes GE, and a gate insulating film GO are formed in semiconductor substrate SUB of the element region ER.

As shown in FIGS. 9 and 12, in the front end step S10, the drain region DRA and the drift region DRI are formed in semiconductor substrate SUB of the outer peripheral region PER. The front end step S10 is performed by a general semiconductor processing process.

As shown in FIG. 7, the back end step S20 includes a contact interlayer insulating film forming step S21, a contact forming step S22, a lower wiring interlayer insulating film forming step S23, a lower wiring forming step S24, a lower via interlayer insulating film forming step S25, a lower via forming step S26, an upper wiring forming step S27, a back surface processing step S28, and a chip completing step S29.

Figure 13:
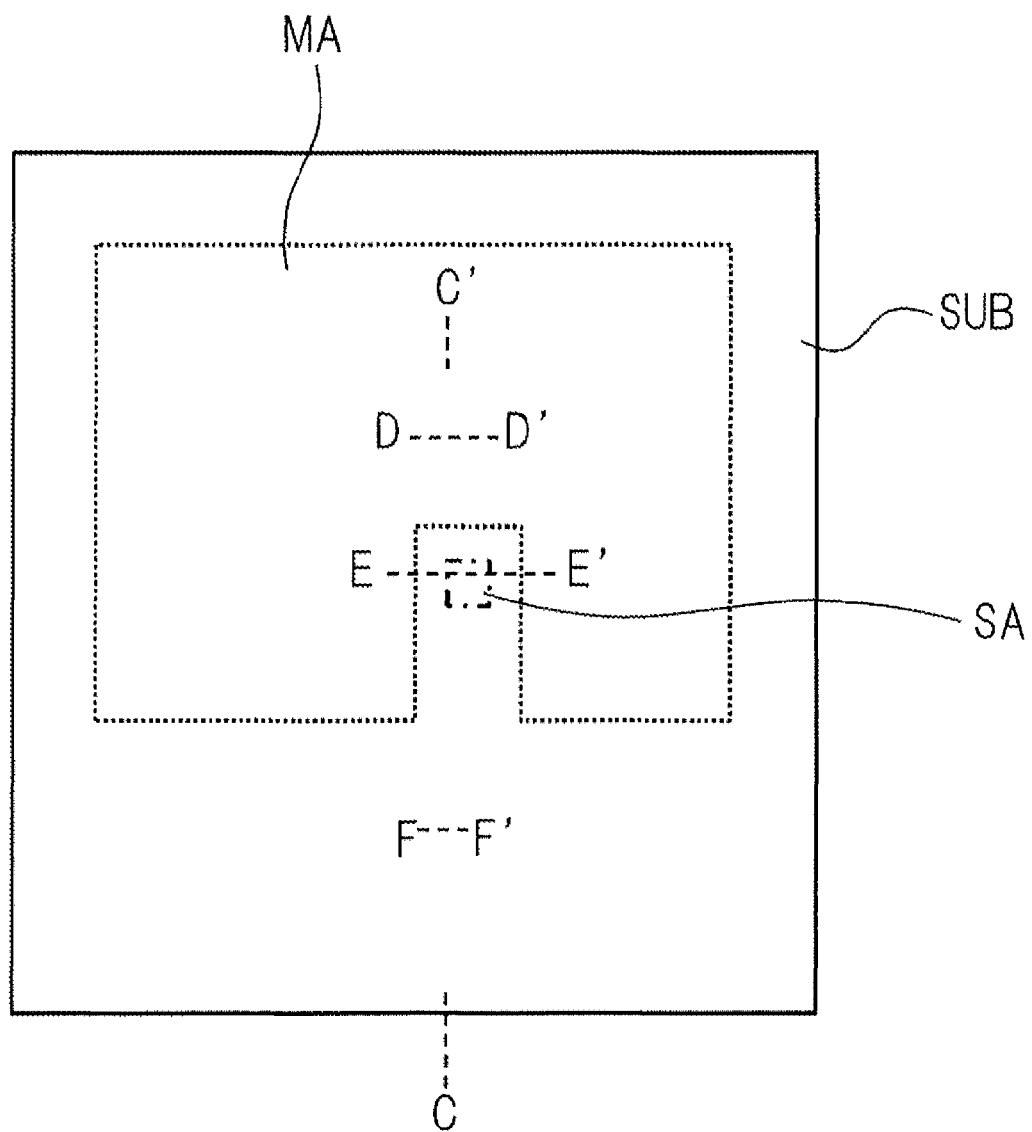
FIG. 13 is a plan view illustrating the configuration of semiconductor device at the end of the contact forming process.
Figure 14:
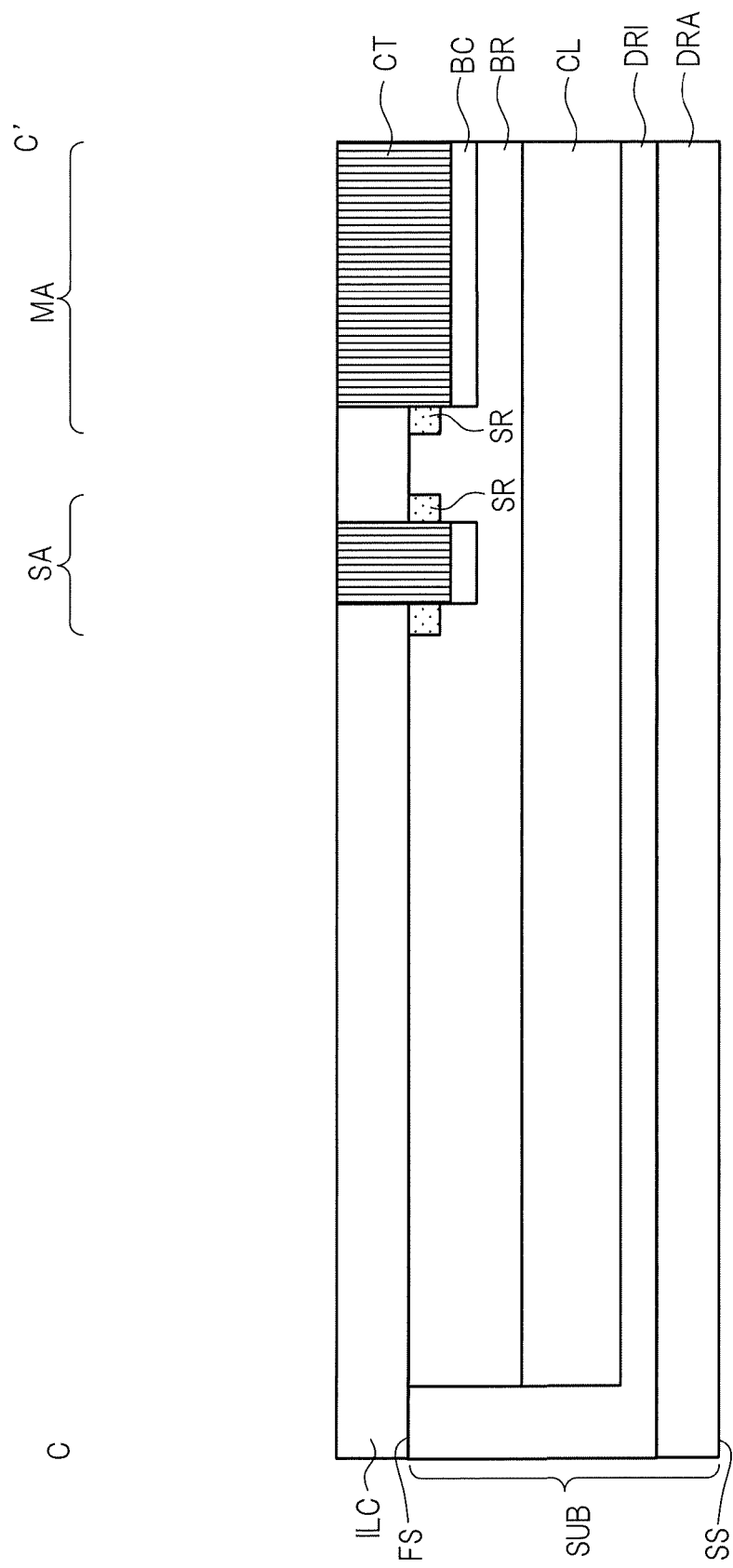
FIG. 14 is C-C' sectional view of FIG. 13.
Figure 15:
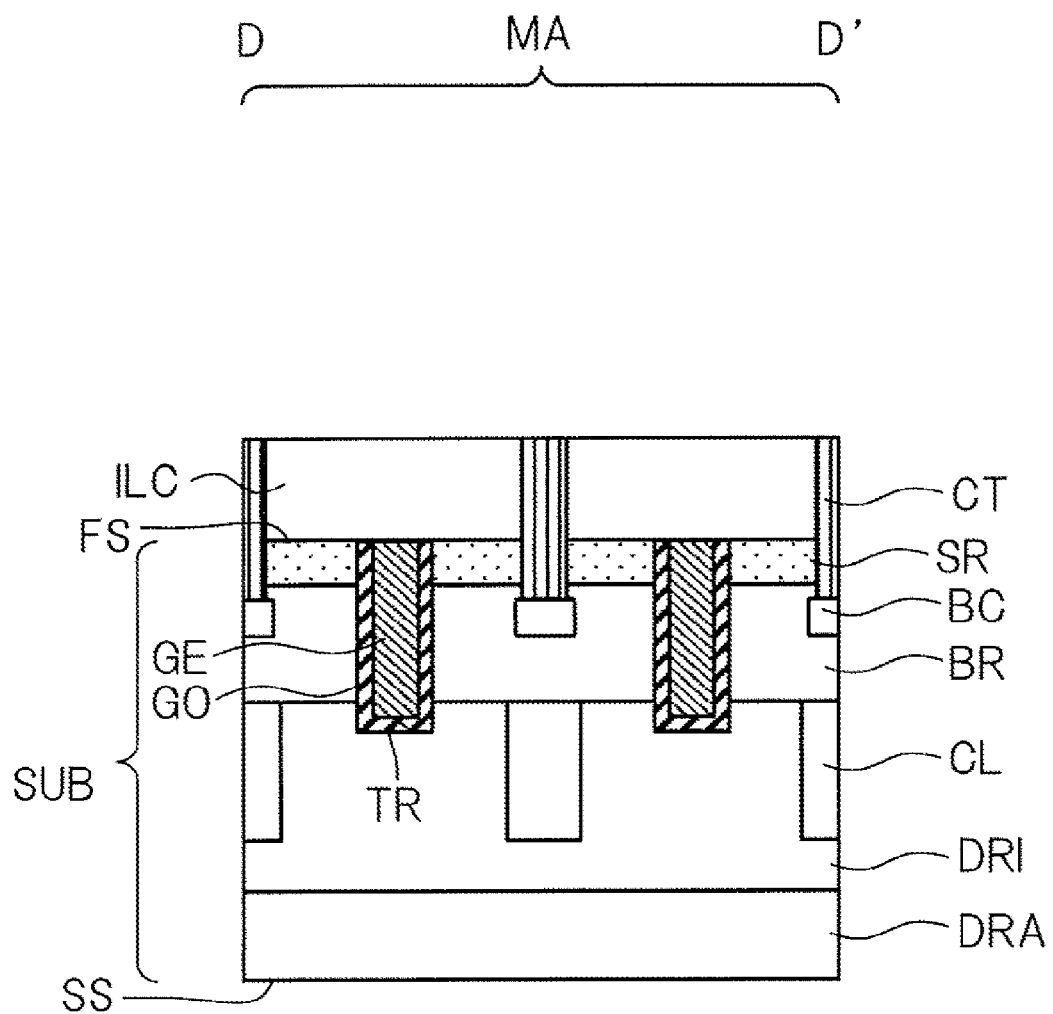
FIG. 15 is D-D' sectional view of FIG. 13.
Figure 16:
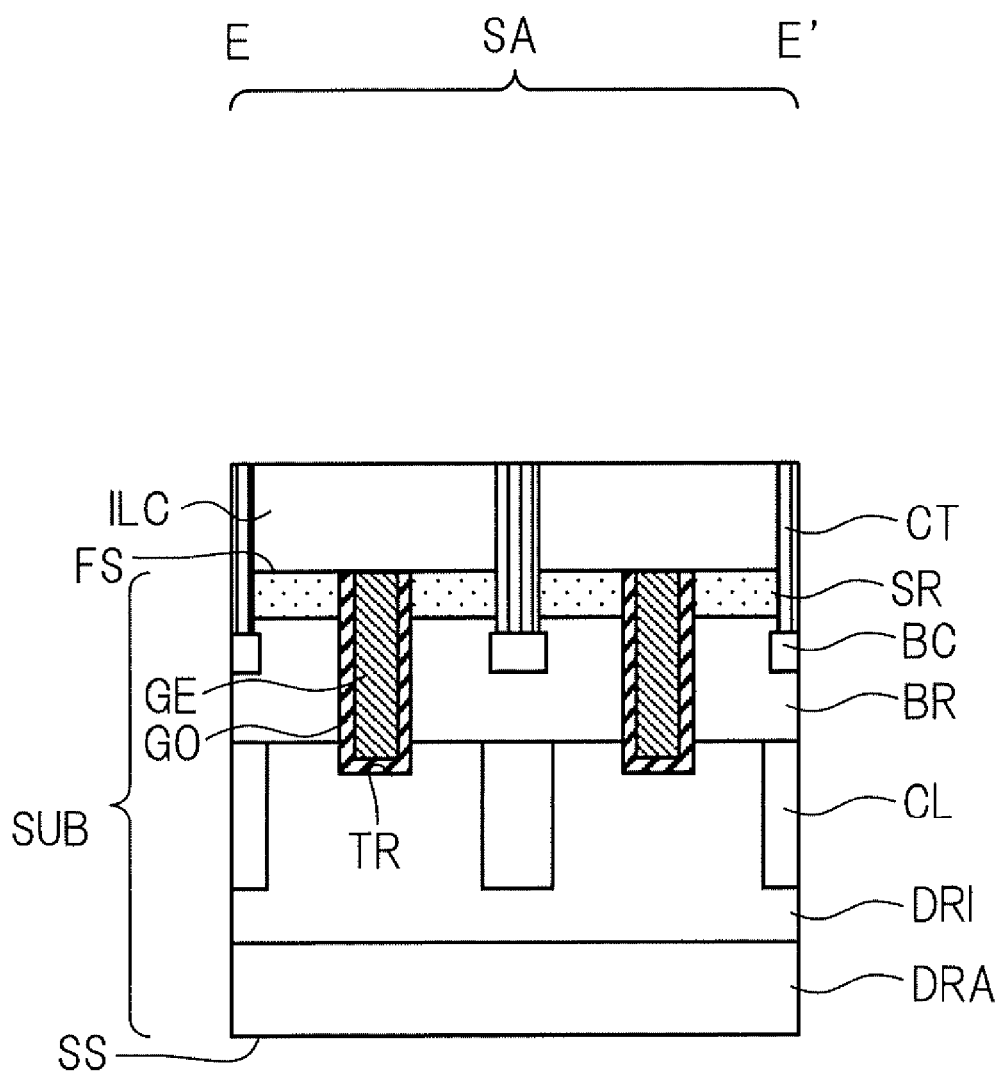
FIG. 16 is E-E' sectional view of FIG. 13.
Figure 17:
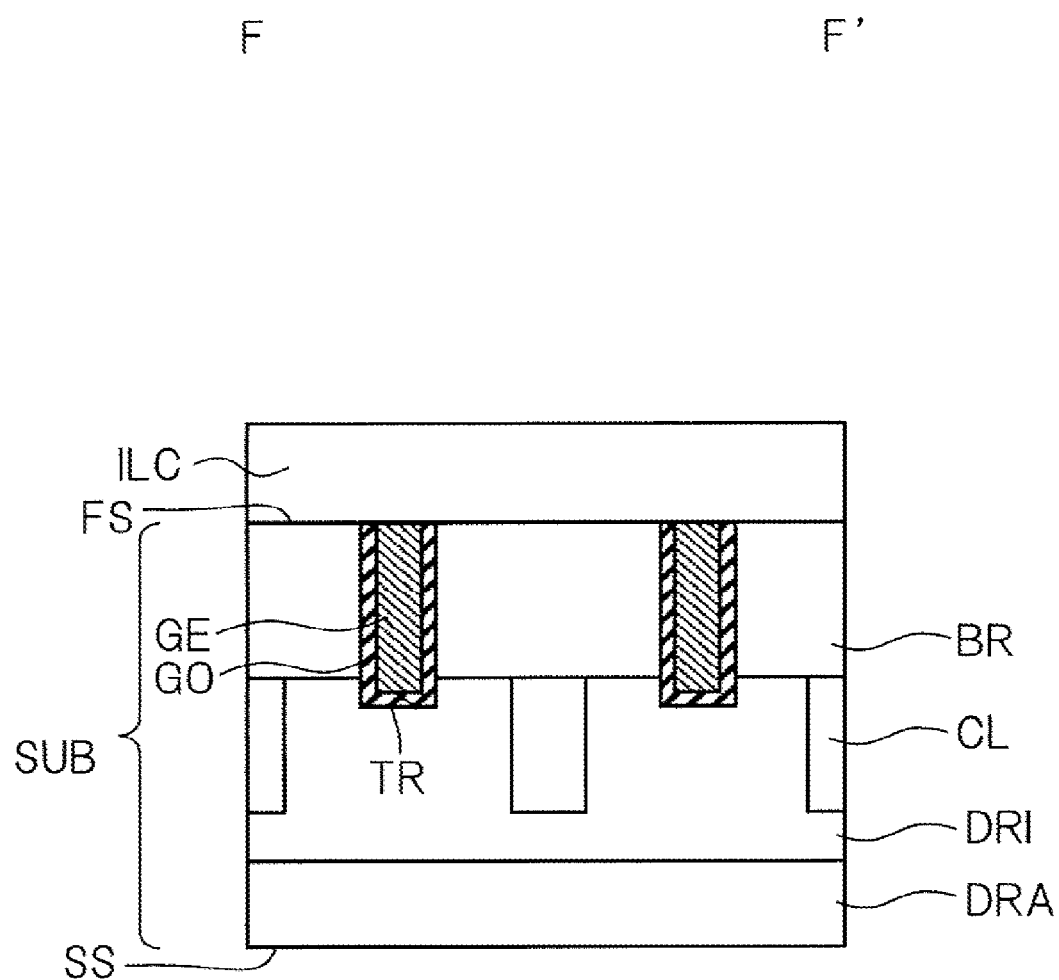
FIG. 17 is F-F' sectional view of FIG. 13.

FIG. 13 is a plan view illustrating the configuration of semiconductor device at the end of the contact forming process. FIG. 14 is C-C' sectional view of FIG. 13. FIG. 15 is D-D' sectional view of FIG. 13. FIG. 16 is E-E' sectional view of FIG. 13. FIG. 17 is F-F' sectional view of FIG. 13.

FIGS. 13 to 17 correspond to FIGS. 8 to 12, respectively. In FIG. 13, the contact CT or the like is omitted.

In the contact interlayer insulating film forming process S21, as shown in FIGS. 14 to 17, a contact interlayer insulating film ILC is formed on the first surface FS of semiconductor substrate SUB. The film formation of the contact interlayer insulating film ILC, for example, CVD (chemical vapor deposition) method or the like is used.

In the contact forming step S22, first, an opening is formed in a portion where the contact CT is formed. The opening is formed so that the lower end reaches the base region BR. Openings are formed using methods such as patterning, for example. Then, when ions are implanted into the opening using a method such as an ion implantation method, a base contact region BC is formed near the lower end of the opening. Thereafter, the contact CT is formed by the opening is embedded in a conductor such as tungsten (W).

Figure 18:
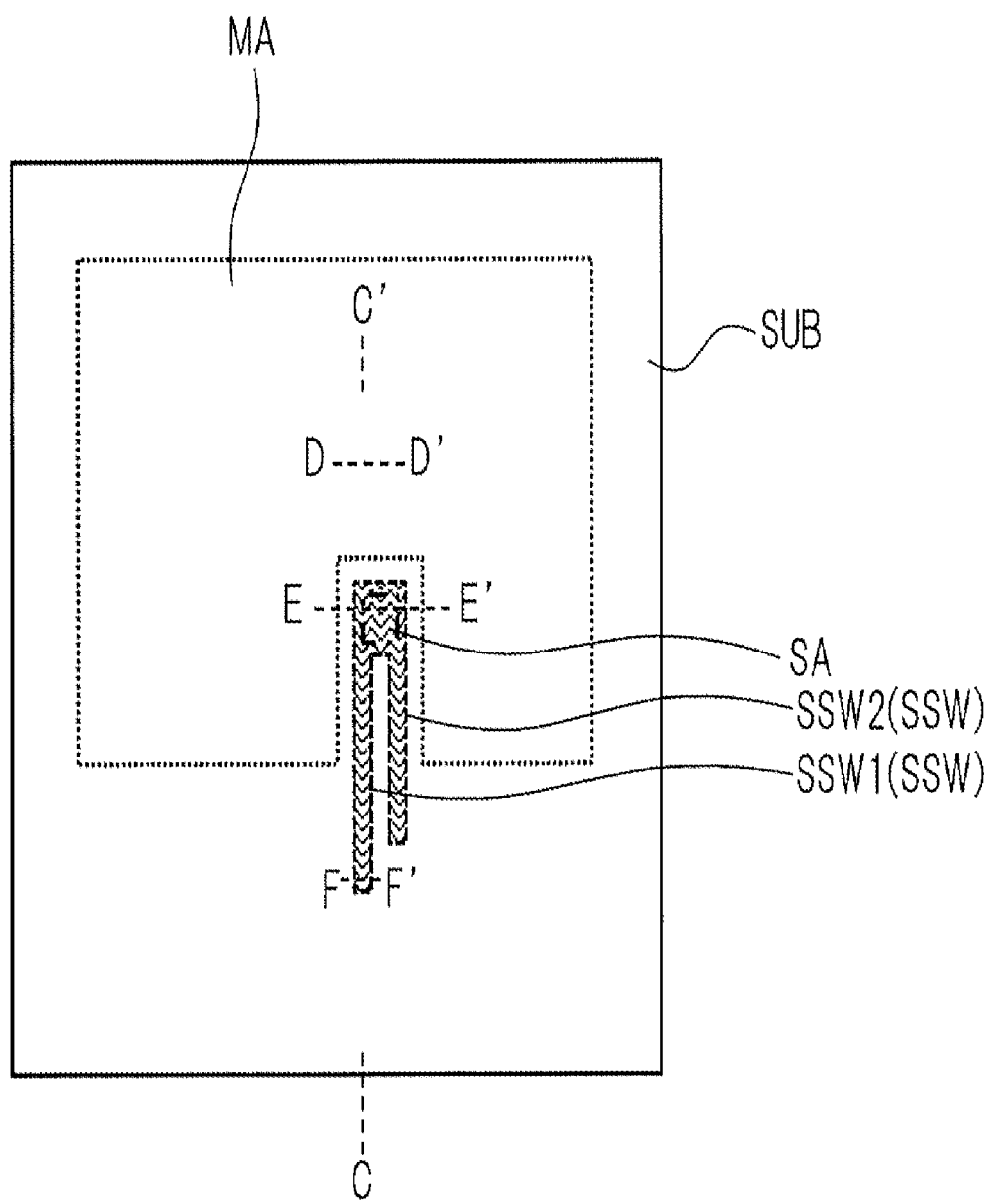
FIG. 18 is a plan view illustrating the configuration of semiconductor device at the completion of the lower layer interconnect forming process.
Figure 19:
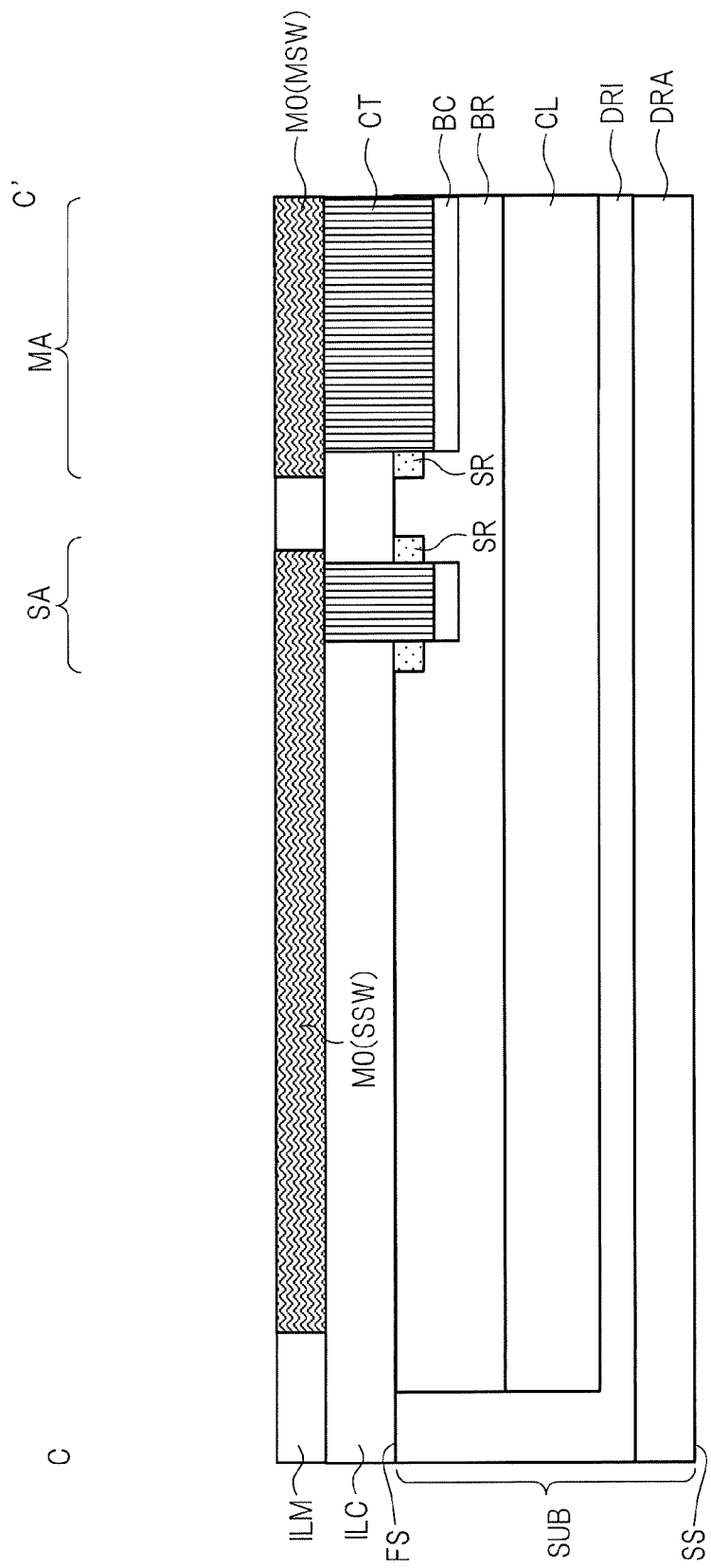
FIG. 19 is C-C' sectional view of FIG. 18.
Figure 20:
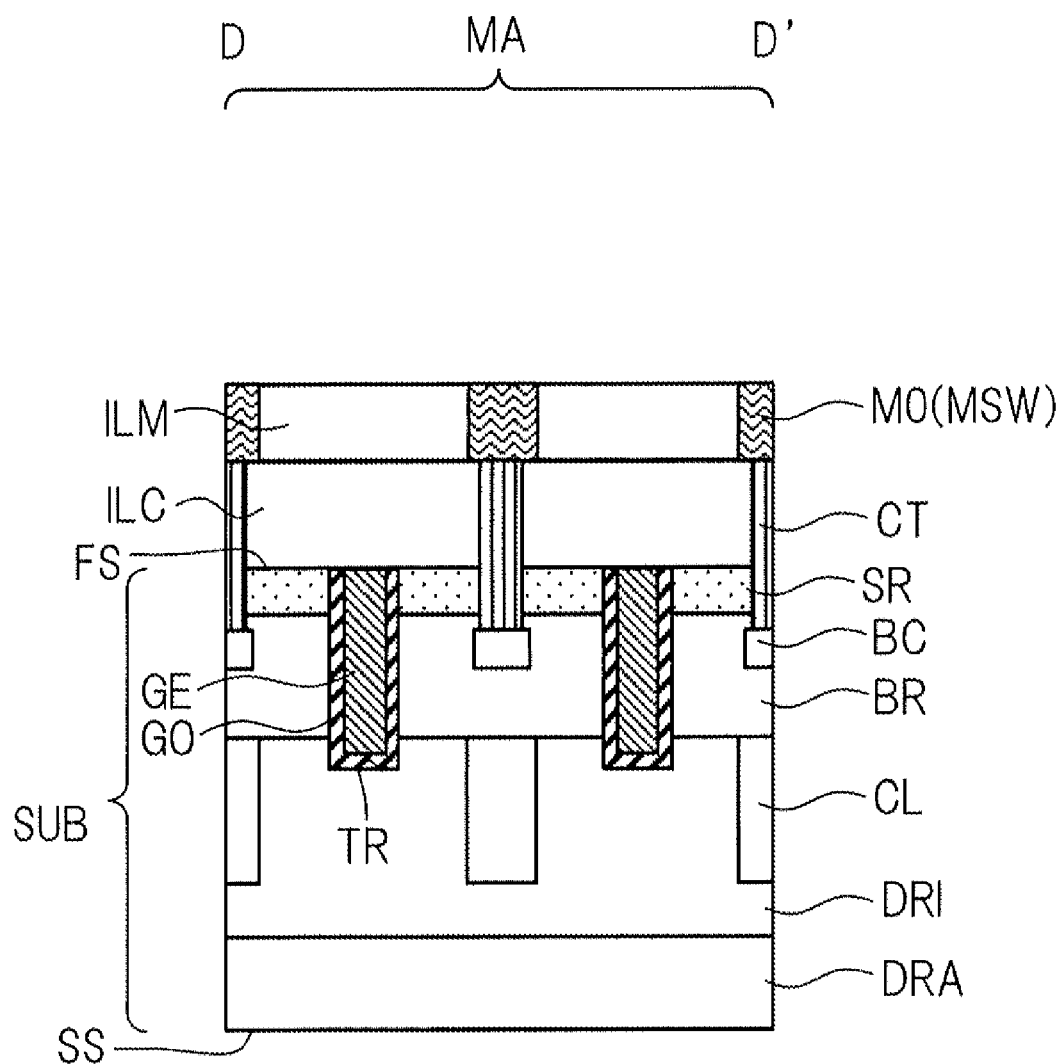
FIG. 20 is D-D' sectional view of FIG. 18.
Figure 21:
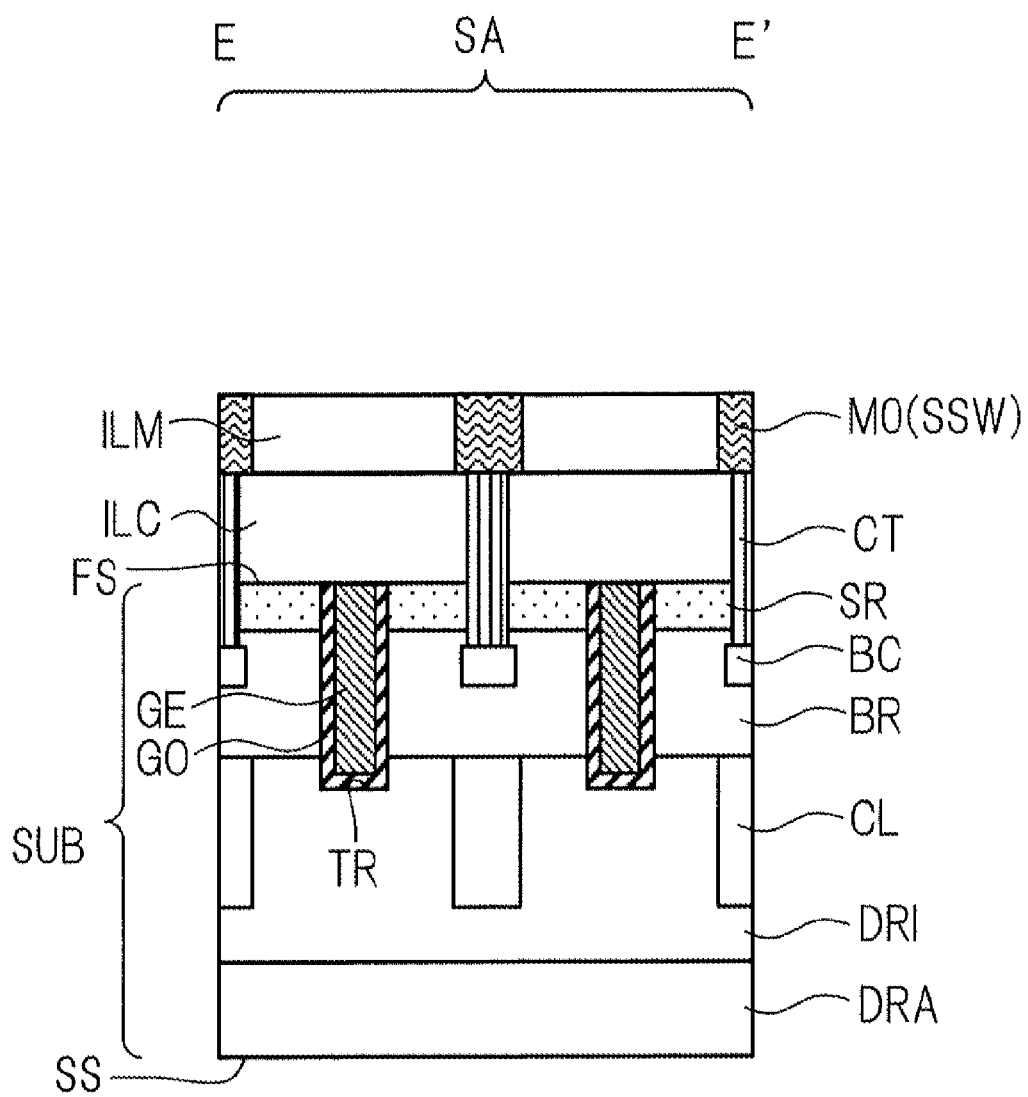
FIG. 21 is E-E' sectional view of FIG. 18.
Figure 22:
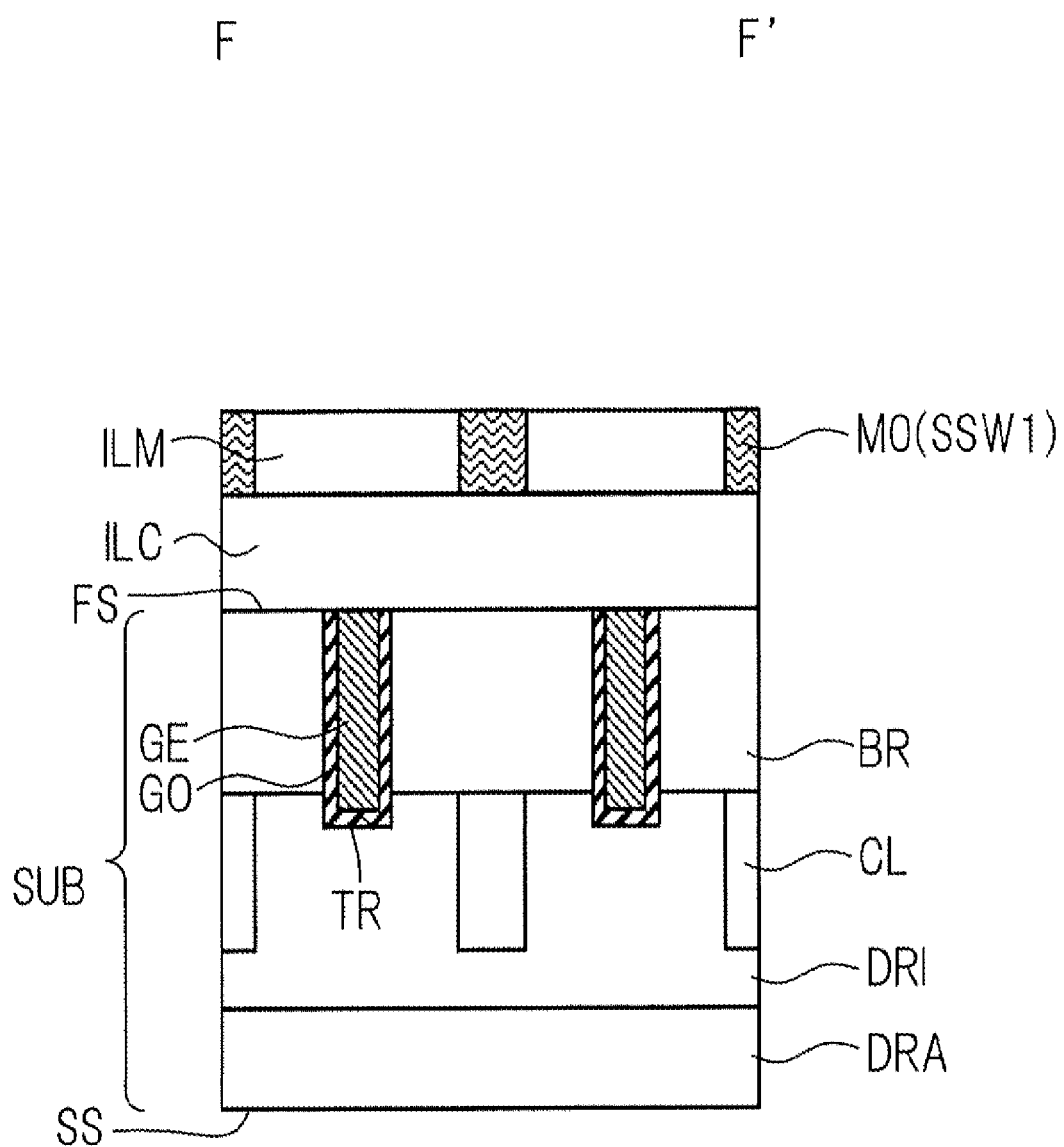
FIG. 22 is F-F' sectional view of FIG. 18.

FIG. 18 is a plan view illustrating the configuration of semiconductor device at the completion of the lower layer interconnect forming process. FIG. 19 is C-C' sectional view of FIG. 18. FIG. 20 is D-D' sectional view of FIG. 18. FIG. 21 is E-E' sectional view of FIG. 18. FIG. 22 is F-F' sectional view of FIG. 18. FIGS. 18 to 22 correspond to FIGS. 13 to 17, respectively.

In the lower wiring interlayer insulating film forming step S23, as shown in FIGS. 19 to 22, the lower wiring interlayer insulating film ILM is formed on semiconductor substrate SUB after the contact CT is formed. That is, the lower wiring interlayer insulating film ILM is formed on the layer including the contact interlayer insulating film ILC and the contact CT. Incidentally, the lowermost portion of the lower wiring interlayer insulating film ILM, the stopper film (not shown) may be formed. The film formation of the lower wiring interlayer insulating film ILM, for example, CVD method or the like is used.

In the lower wiring forming step S24, first, an opening pattern of the lower wiring interlayer insulating film ILM is formed in a region in the vicinity of the contact CT and in a region in which the lower wiring M0 (for example, a main circuit source wiring MSW, a sense circuit source wiring SSW, or the like described later) is formed. The opening pattern is formed so as to expose the contact CT and the region in the z thereof, as well as the contact interlayer insulating film ILC of the region where the lower layer wiring M0 is formed. The aperture pattern is formed using, for example, a method such as patterning. Then, the lower layer interconnect M0 is formed by the opening pattern is embedded in the conductor. The lower layer wiring M0 is preferably made of a material having a resistor higher than that of the main circuit source electrode MSF (for example, tungsten (W), tantalum (Ta), titanium (Ti), titanium nitride (TiN), molybdenum (Mo), or the like).

As a result, the contact CT is connected to the lower layer wiring M0. The formed sense circuit source wiring SSW extends from the sense circuit region SA to the outer peripheral region PER.

In FIGS. 20 and 21, the main MOS and sense MOS have the same structure. However, as shown in FIG. 19, the main circuit source wiring MSW is provided to flow the current from the contact CT to the upper layer of the main circuit source electrode MSF (described later). On the other hand, the sense circuit source wiring SSW is provided to draw the current from the contact CT in the lateral direction (i.e., to the outer peripheral region PER). The sense circuit source wiring SSW is also provided with a function for the source voltage measurement of the sense MOS.

Figure 23:
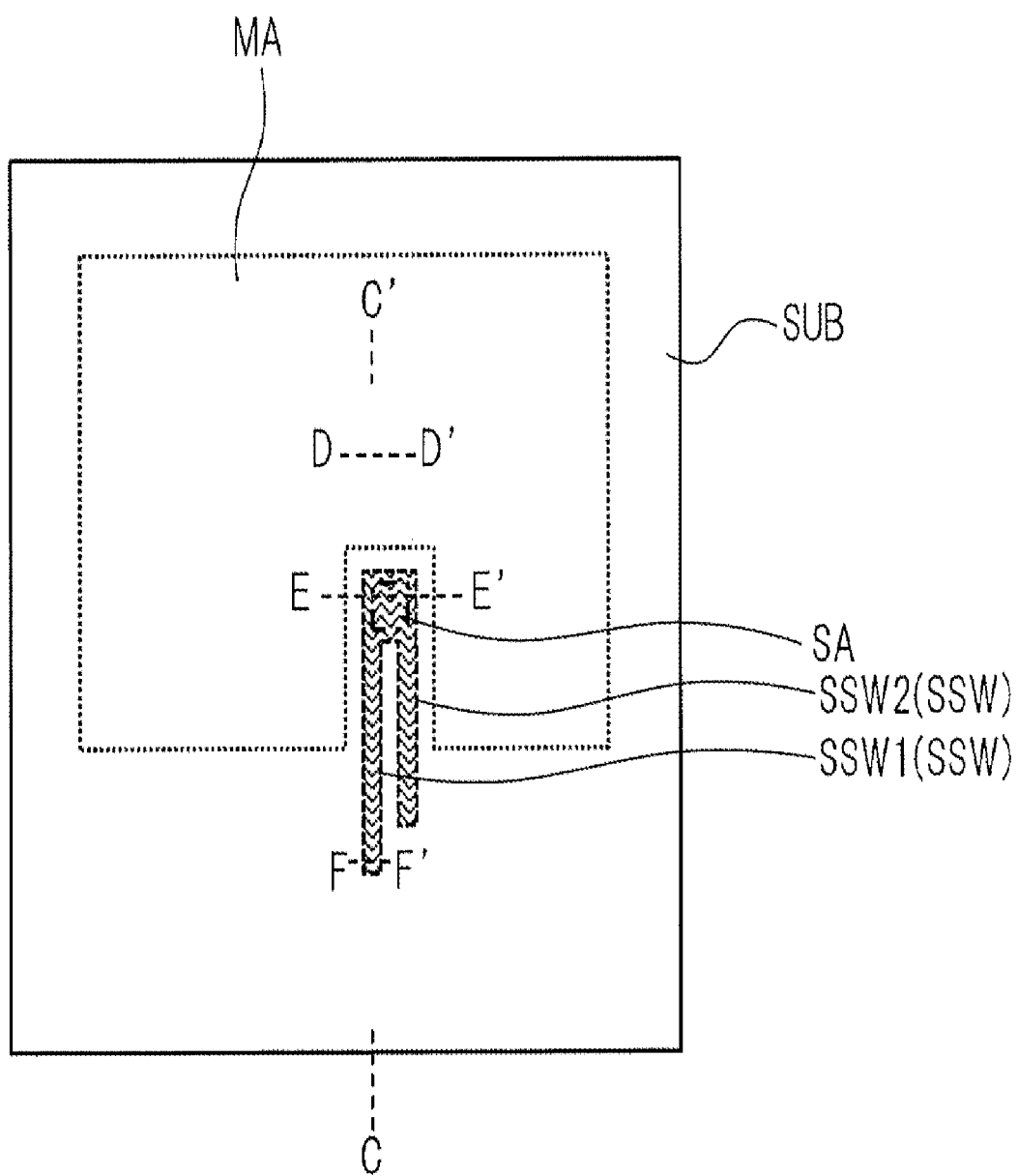
FIG. 23 is a plan view illustrating an exemplary semiconductor device at the end of the lower layer via forming step.
Figure 24:
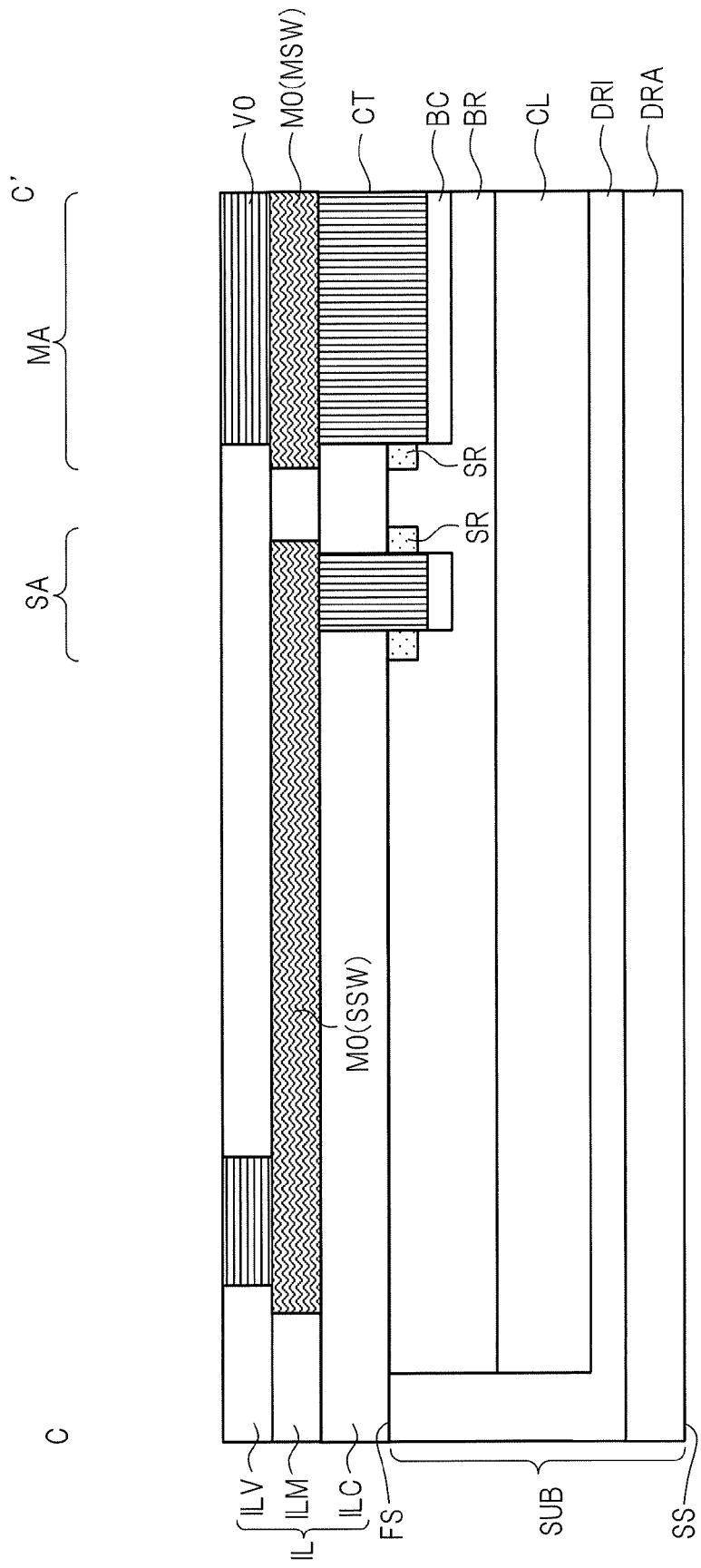
FIG. 24 is C-C' sectional view of FIG. 23.
Figure 25:
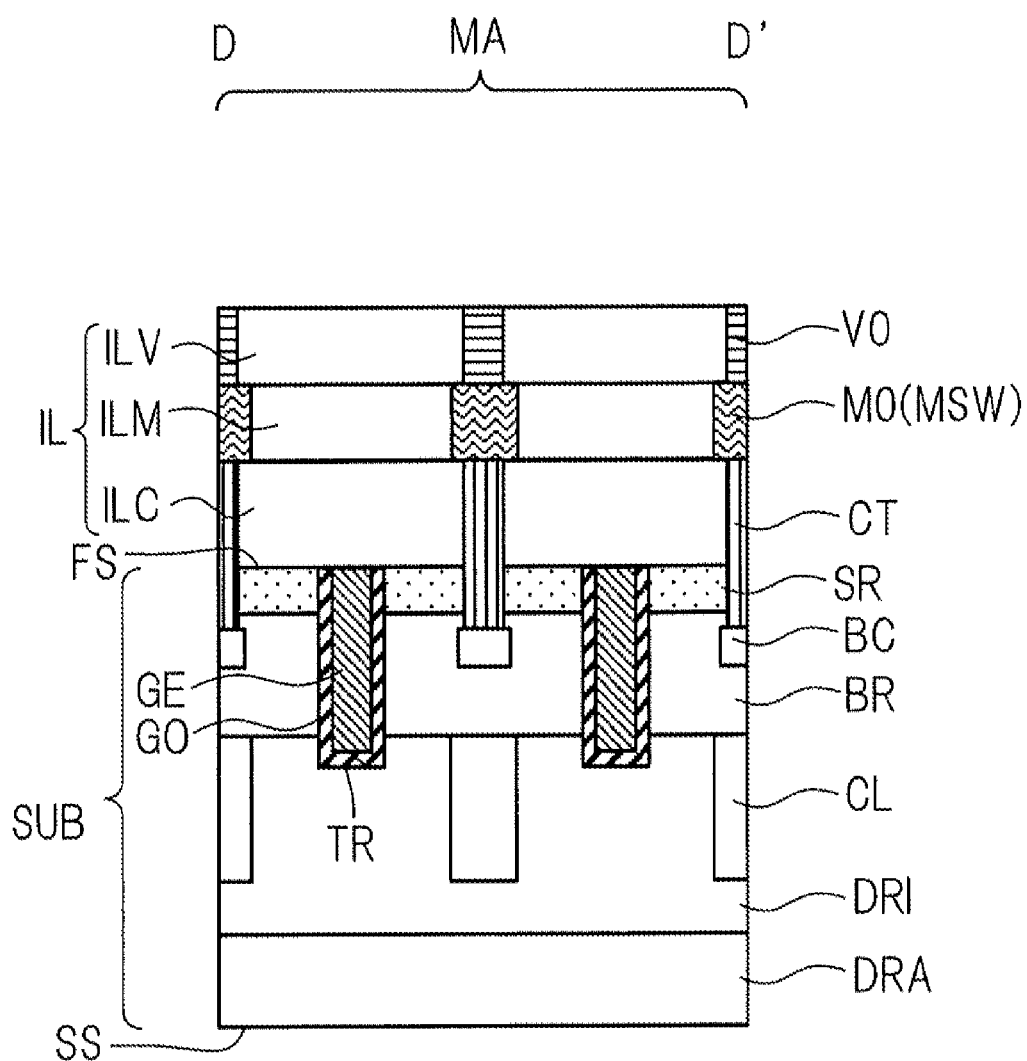
FIG. 25 is D-D' sectional view of FIG. 23.
Figure 26:
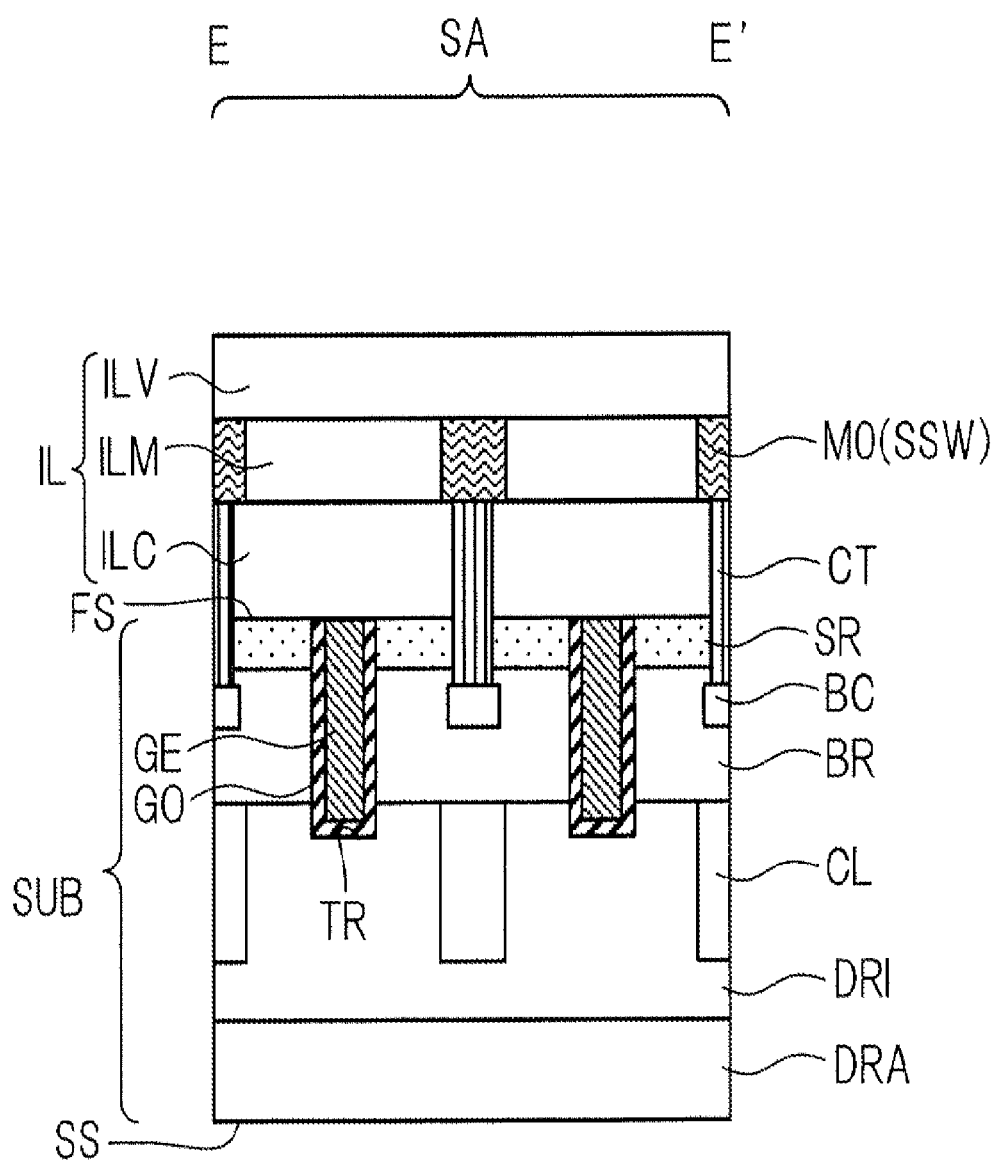
FIG. 26 is E-E' sectional view of FIG. 23.
Figure 27:
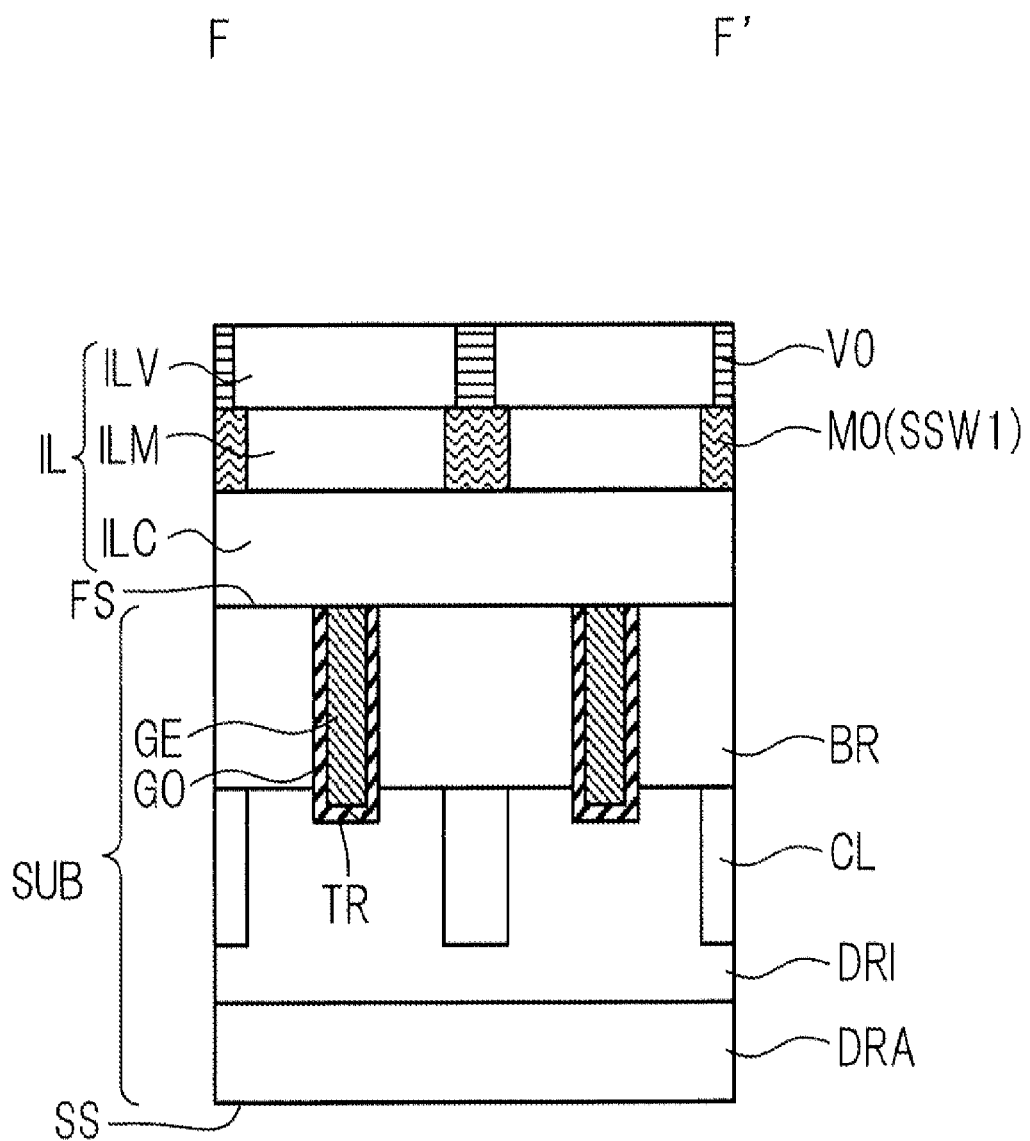
FIG. 27 is F-F' sectional view of FIG. 23.

FIG. 23 is a plan view illustrating an exemplary semiconductor device at the end of the lower layer via forming step. FIG. 24 is C-C' sectional view of FIG. 23. FIG. 25 is D-D' sectional view of FIG. 23. FIG. 26 is E-E' sectional view of FIG. 23. FIG. 27 is F-F' sectional view of FIG. 23. FIGS. 23 to 27 correspond to FIGS. 18 to 22, respectively.

In the lower via interlayer insulating film forming step S25, as shown in FIGS. 24 to 27, the lower via interlayer insulating film ILV is formed on semiconductor substrate SUB after the lower layer wiring M0 is formed. That is, the lower via interlayer insulating film ILV is formed on a layer including the lower wiring interlayer insulating film ILM and the lower layer wiring M0. Incidentally, the lowermost portion of the lower via interlayer insulating film ILV, stopper film (not shown) may be formed. The film formation of the lower via interlayer insulating film ILV, for example, CVD method or the like is used.

In the lower layer via formation step S26, first, an opening is formed in a portion where the lower layer via V0 is to be formed. The opening is formed so that the lower end reaches the lower layer wiring M0. Openings are formed using methods such as patterning, for example. Then, the lower layer via V0 is formed by embedded the opening with a conductor such as tungsten (W).

As shown in FIG. 25, the lower layer via V0 of the main circuit region MA is provided to electrically connect the main circuit source wiring MSW and the upper layer main circuit source electrode MSF. On the other hand, as shown in FIGS. 24, 26, and 27, although the lower layer via V0 is not formed in the sense circuit region SA, the lower layer via V0 for connecting the sense circuit source wiring SSW and the sense circuit source electrode SSF, and the lower layer via V0 for connecting the sense circuit source wiring SSW and the sense circuit source kelvin electrode SSS are respectively formed in the outer peripheral region PER.

Figure 28:
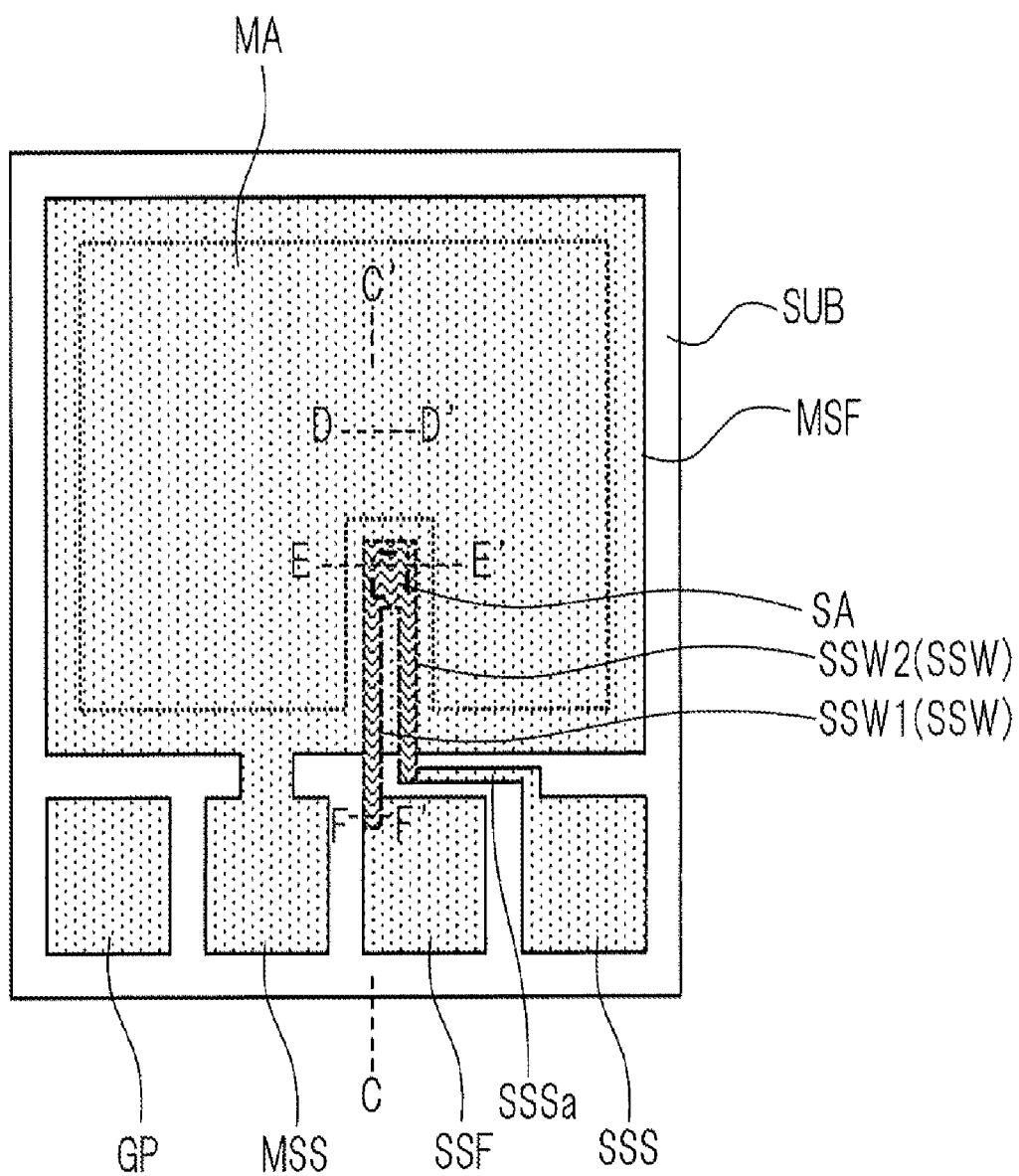
FIG. 28 is a plan view illustrating an exemplary semiconductor device at the end of the chip completion process.
Figure 29:
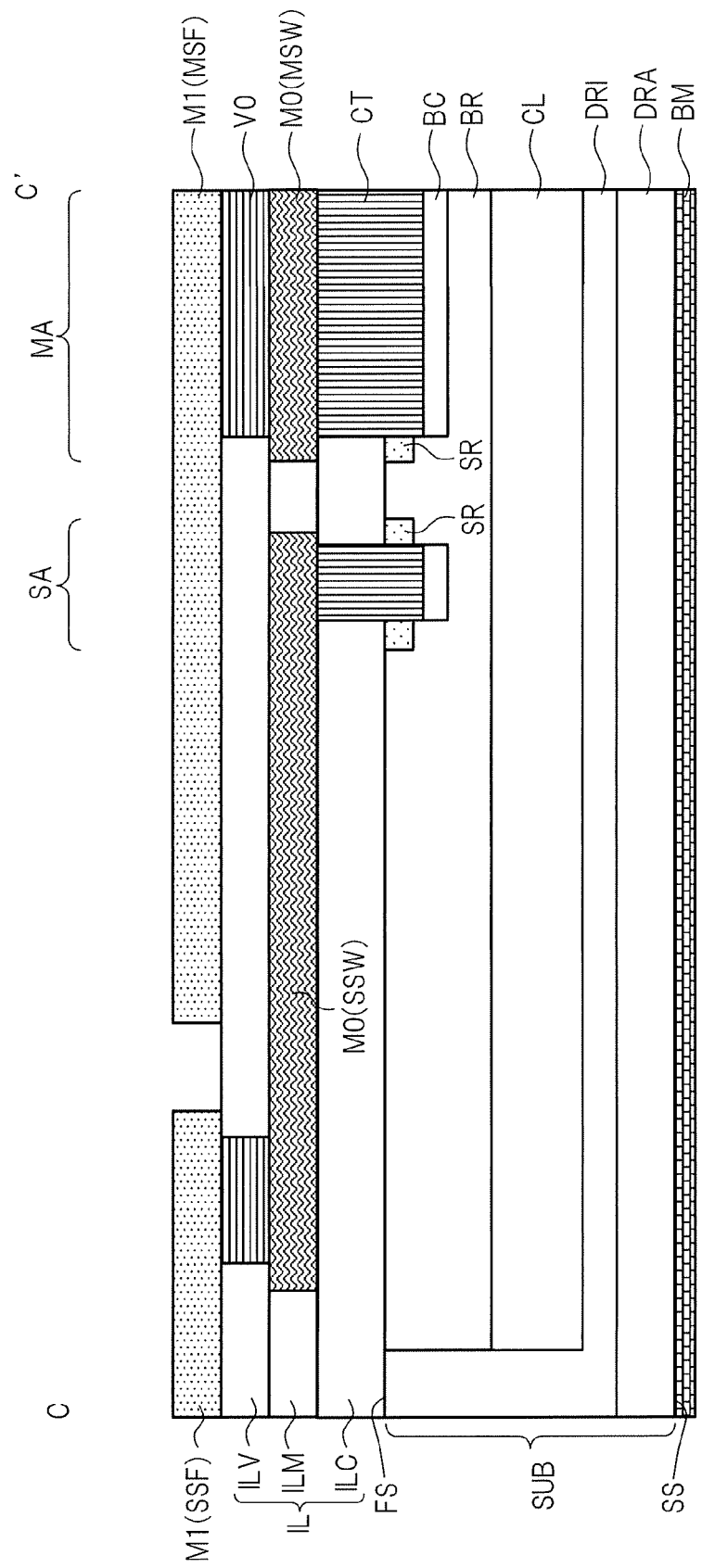
FIG. 29 is C-C' sectional view of FIG. 28.
Figure 30:
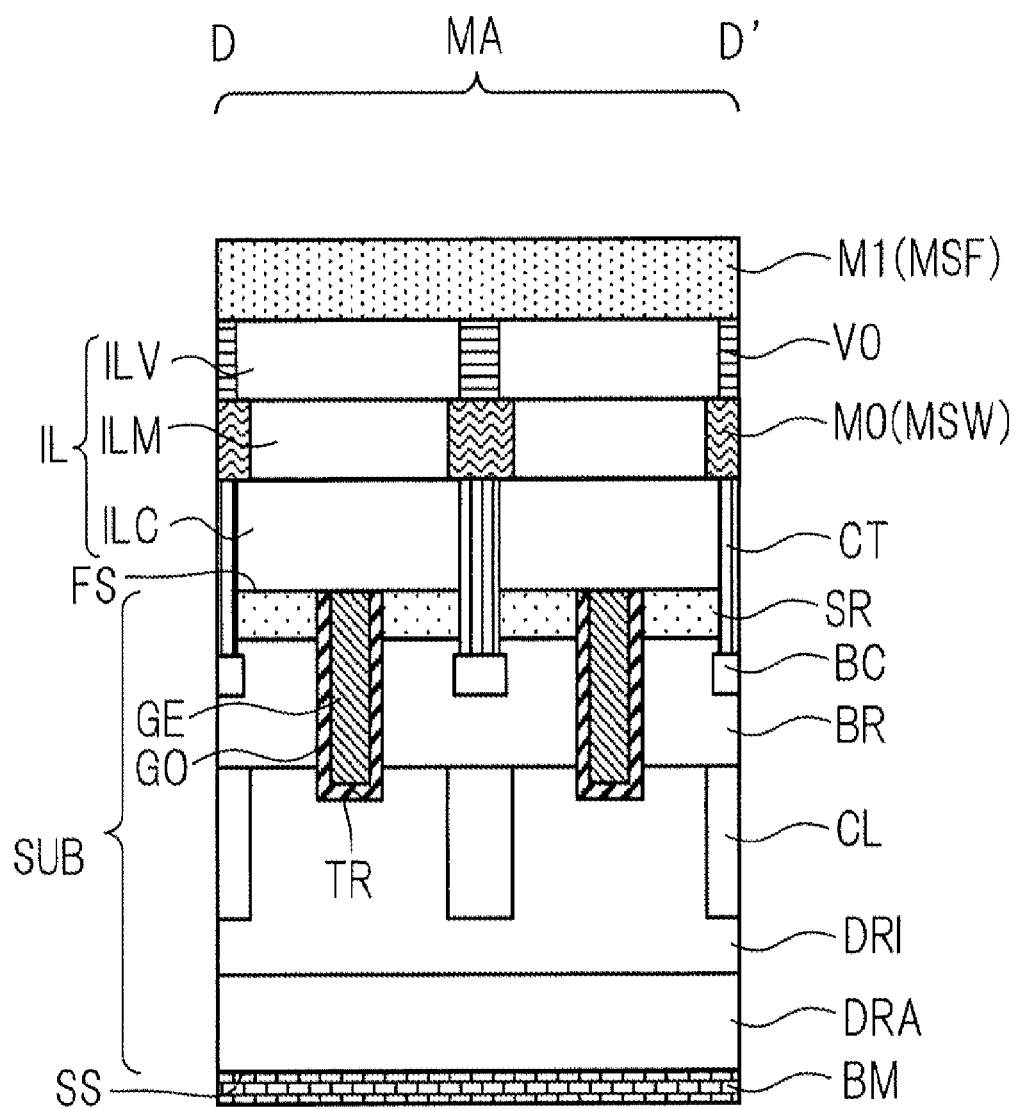
FIG. 30 is D-D' sectional view of FIG. 28.
Figure 31:
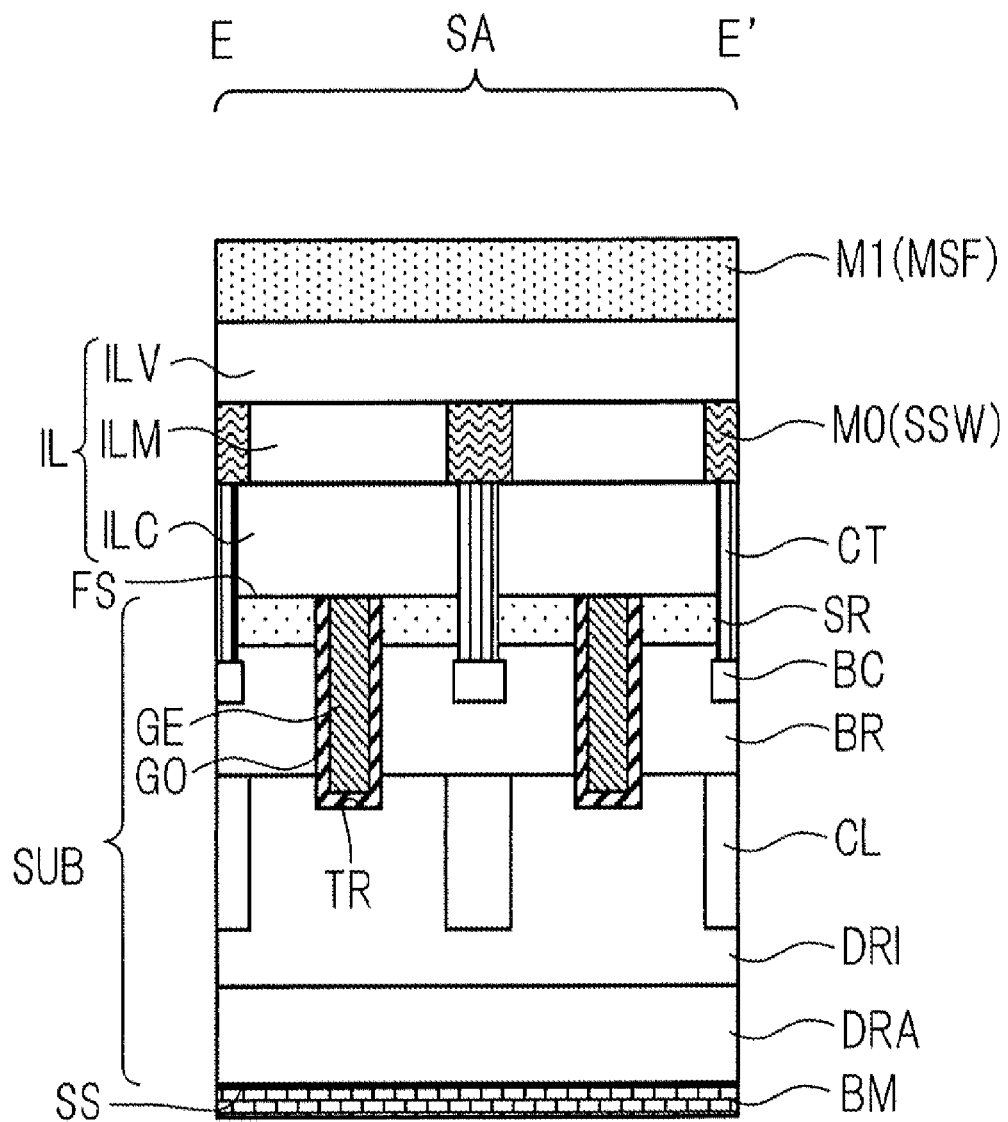
FIG. 31 is E-E' sectional view of FIG. 28.
Figure 32:
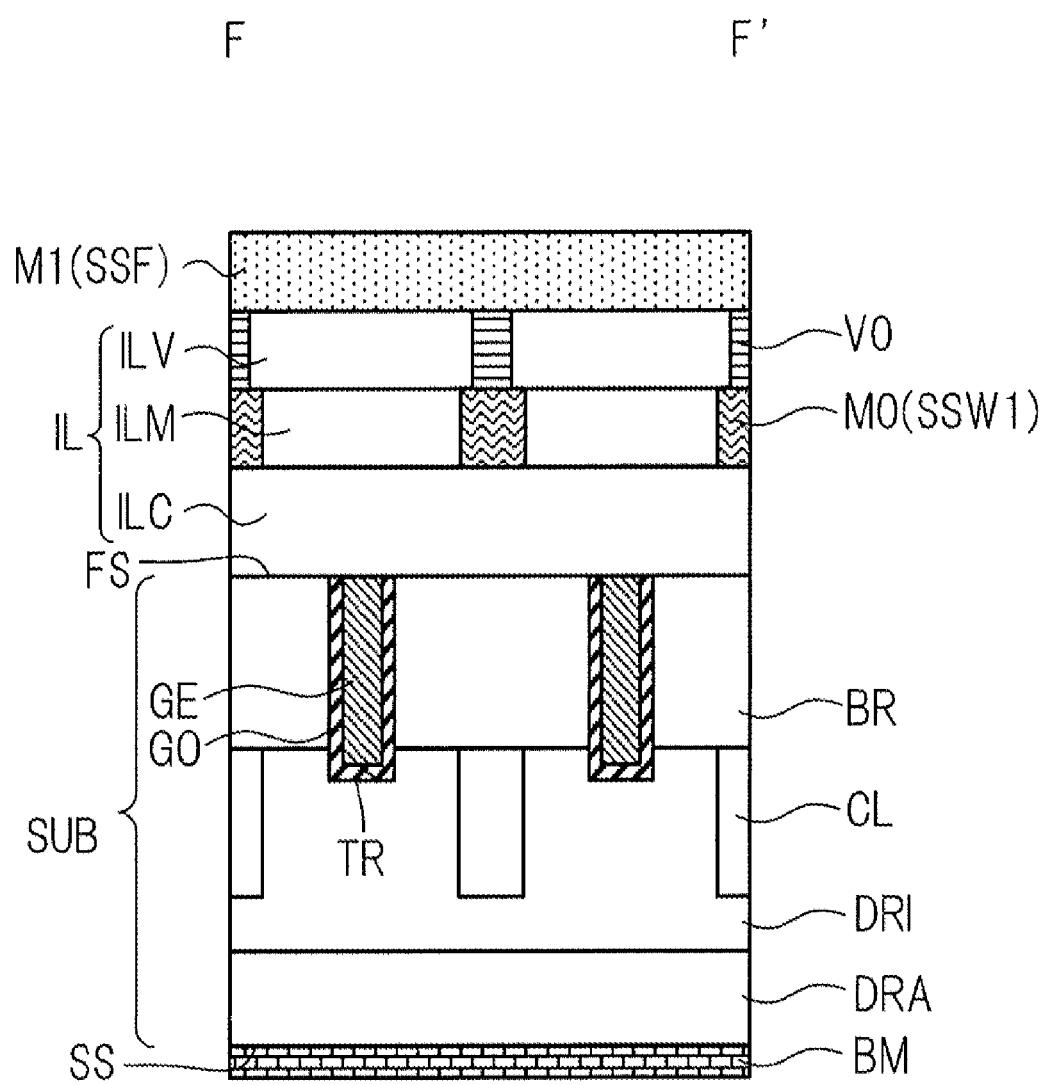
FIG. 32 is F-F' sectional view of FIG. 28.

FIG. 28 is a plan view illustrating an exemplary semiconductor device at the end of the chip completion process. FIG. 29 is C-C' sectional view of FIG. 28. FIG. 30 is D-D' sectional view of FIG. 28. FIG. 31 is E-E' sectional view of FIG. 28. FIG. 32 is F-F' sectional view of FIG. 28. FIGS. 28 to 32 correspond to FIGS. 23 to 27, respectively.

In the upper layer interconnection forming step S27, first, a conductive film is formed on semiconductor substrate SUBs after the lower layer vias V0 are formed. Conductive film is formed on substantially the entire surface of the first surface FS side of semiconductor substrate SUB. Components of the conductive film are, for example, aluminum or the like. Then, the conductive film is patterned to form a main circuit source electrode MSF which is an upper layer wiring, a main circuit source Kelvin electrode MSS, a sense circuit source electrode SSF, a sense circuit source Kelvin electrode SSS, a wiring SSSa, a gate electrode GP, and the like. In the upper wiring forming step S27, after forming each electrode, a protective film (not shown) may be formed to cover other than the clip region or the bonding region of each electrode as necessary.

In the back surface processing step S28, by grinding the second surface SS (back surface) side of semiconductor substrate SUB, semiconductor substrate SUB to a predetermined thickness. Then, after grinding semiconductor substrate SEB, the back-electrode BM is deposited by a method such as sputtering as required.

In the chip completion step S29, as shown in FIGS. 2 to 6, the second surface SS of semiconductor substrate SUB is connected to the die frame DF using the die bonding material DB. Further, the first surface FS side of semiconductor substrate SUB is connected to the clip frame CF using a clip bonding material CB.

Main Effects According to First Embodiment

According to present embodiment, the sense circuit region SA is covered with the source electrode MSF for the main circuit. Further, the outer peripheral region PER, the sense circuit source electrode SSF is provided, the sense circuit source wiring SSW for connecting the sense MOS and the sense circuit source electrode SSF is provided in the lower layer of the main circuit source electrode MSF.

According to this configuration, it is possible to provide a main circuit source electrode MSF in substantially the entire area of the element region ER including the sense circuit region SA, it is possible to effectively utilize the chip area.

Further, according to this configuration, by the sense circuit source wiring SSW is disposed in the lower layer of the main circuit source electrode MSF, the main circuit source electrode MSF is not necessary to avoid the sense circuit source wiring SSW. Thus, the main circuit source electrode MSF can be a uniform shape without notch. Then, by this, it is possible to eliminate the constraint of the clip region including the position and shape, or the constraint of the bonding region. Thus, it is possible to improve the contact area between the main circuit source electrode MSF and the clip frame CF, or to improve the area of the bonding region of the main circuit source electrode MSF. In addition, this makes it possible to reduce the contact resistance in the clip region or the bonding region.

Further, according to present embodiment, the sense circuit source wiring SSW is provided in the same layer as the main circuit source wiring MSW. According to this configuration, it is possible to form the sense circuit source wiring SSW and the main circuit source wiring MSW in the same process.

Second Embodiment

Next, second embodiment will be described. In present embodiment, the sense circuit source wiring SSW is divided by a wiring for flowing a drain current of the semiconductor element of the sense circuit region SA, and a wiring for monitoring the source potential of the semiconductor element of the sense circuit region SA.

Figure 33:
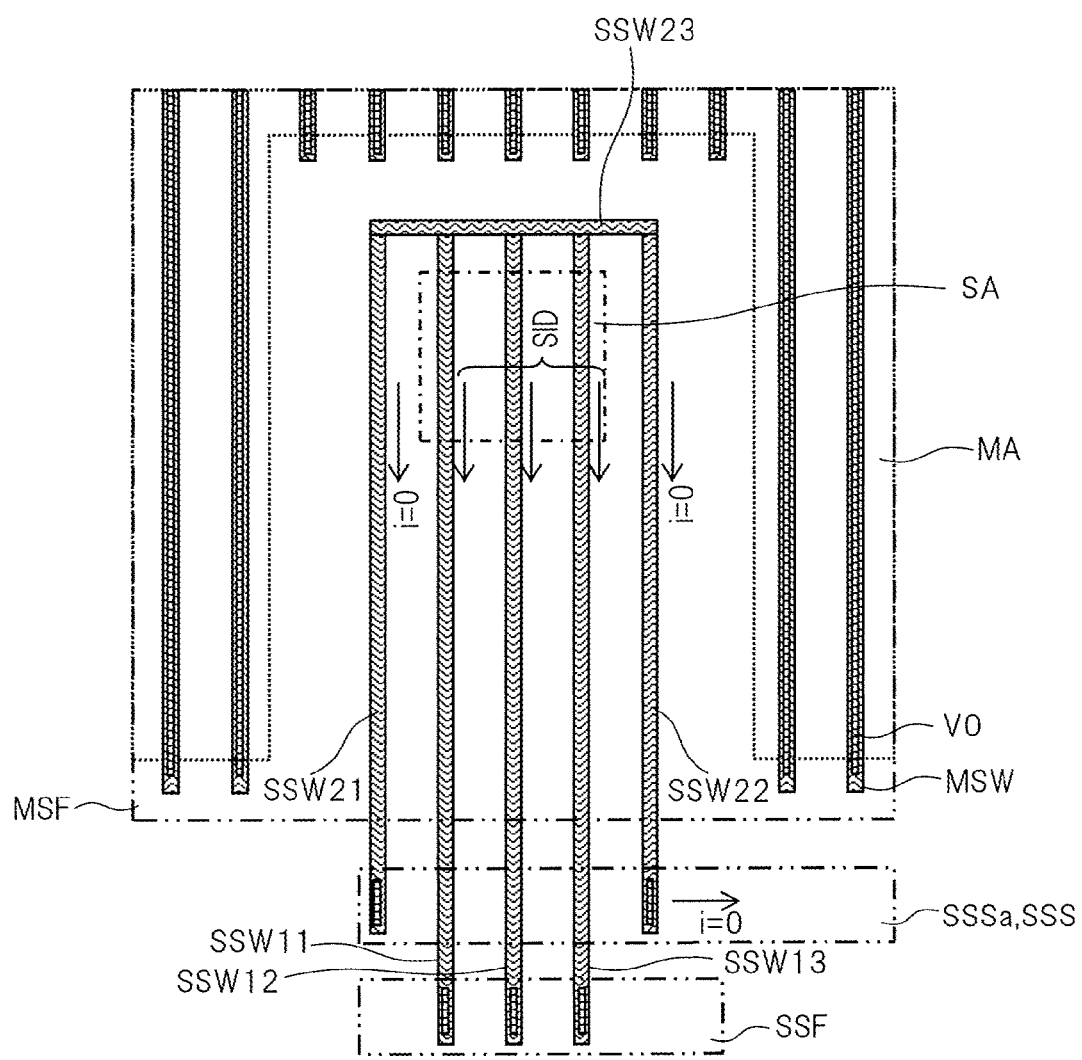
FIG. 33 is an enlarged main portion view of a semiconductor device according to second embodiment of the present invention.

FIG. 33 is an enlarged main portion view of a semiconductor device according to second embodiment of the present invention. In FIG. 33, a region including the sense circuit region SA and the sense circuit source electrode SSF or the like in a plan view is enlarged and showed. Incidentally, in FIG. 33, mainly the sense circuit source wiring SSW and the main circuit source wiring MSW is shown.

As shown in FIG. 33, the main circuit region MA, a plurality of main circuit source wiring MSW extending in the same direction is arranged at a predetermined pitch in a direction different from the extending direction (first direction) (second direction). However, the region between the sense circuit region SA and the sense circuit source electrode SSF (or the sense circuit source Kelvin electrode SSS) is not arranged main circuit source wiring MSW. That is, in this region, even if the semiconductor element is provided, a state that does not function as a main MOS because the main circuit source wiring MSW is not disposed.

In the region between the sense circuit region SA and the sense circuit source electrode SSF, the sense circuit source wiring SSW11 to SSW13 intersecting the sense circuit region SA in a plan view (SSW) is disposed. The sense circuit source wiring SSW11 to SSW13 is a wiring for flowing a drain current SID of the sense MOS. The sense circuit source wiring SSW11 to SSW13, similarly to the main circuit source wiring MSW extends in the first direction, are arranged in the second direction.

Specifically, the sense circuit source wiring SSW11 to SSW13, as shown in FIG. 33, one end extends to the sense circuit source electrode SSF side, the other end extends to the region opposite to the sense circuit source electrode SSF across the sense circuit region SA. One end of the sense circuit source wiring SSW11 to SSW13 is connected to the sense circuit source electrode SSF through the lower layer via V0 of the outer peripheral region PER.

In contrast, the other end of the sense circuit source wiring SSW11 to SSW13 is connected to the sense circuit source wiring SSW23 to be described later, respectively. The number of the sense circuit source wiring SSW for flowing the drain current of the sense MOS is not limited to the example of FIG. 33.

Further, in the vicinity of the sense circuit region SA, the sense circuit source wiring SSW21 to SSW23 is disposed. The sense circuit source wiring SSW21 to SSW23 is a wiring for drawing the source voltage of the sense MOS to the outer peripheral region PER. The sense circuit source wiring SSW21 to SSW22, similarly to the sense circuit source wiring SSW11 to SSW13 or the like extends in the first direction, are arranged in the second direction.

Specifically, the sense circuit source wiring SSW21 to SSW22, as shown in FIG. 33, is disposed outside the sense circuit region SA so as to sandwich the sense circuit region SA. The sense circuit source wiring SSW21 to SSW22 has one end extending to the sense circuit source electrode SSF (or the sense circuit source Kelvin electrode SSS) side, the other end extending across the sense circuit region SA to a region opposite to the sense circuit source electrode SSF (or sense circuit source Kelvin electrode SSS). One end of the sense circuit source wiring SSW21 to SSW22 is connected to the sense circuit source Kelvin electrode SSS through the lower layer via V0, the wiring SSSa. In contrast, the other end of the sense circuit source wiring SSW21 to SSW22 is connected to the sense circuit source wiring SSW23.

The sense circuit source wiring SSW23 is disposed across the sense circuit region SA opposite to the sense circuit source electrode SSF (or the sense circuit source Kelvin electrode SSS). The sense circuit source wiring SSW23 is a wiring for connecting the sense circuit source wiring SSW21 and SSW22. In FIG. 33, a source wiring SSW23 for a sense circuit extending in a second direction is illustrated, but is not limited to such an example.

Further, as described above, the sense circuit source wiring SSW23 is connected to the other end of the sense circuit source wiring SSW11 to SSW13. Thus, in the vicinity of the sense circuit region SA, the sense circuit source wiring SSW11 to SSW13 has a configuration as surrounded by the sense circuit source wiring SSW21 to SSW23.

During operation of semiconductor device DEV, the sense MOS drain current SID flows from the sense circuit region SA to the sense circuit source electrode SSF in the sense circuit source wiring SSW11 to SSW13. In contrast, the sense circuit source wiring SSW21 to SSW23 drainage current SID hardly flows. This is because the sense circuit source wiring SSW23 is disposed across the sense circuit region SA opposite side the sense circuit source electrode SSF and deviates from the main current path of the drain current SID.

According to present embodiment, by separating the wiring for flowing the drain current of the sense MOS and the wiring for measuring the source voltage of the sense MOS, it is possible to reduce the current flowing through the sense circuit source wiring SSW21 to SSW23 for measuring the source voltage of the sense MOS. Thus, the drain current SID of the sense MOS, the voltage drop components in the sense circuit source wiring SSW21 to SSW23 is not included. Thus, it is possible to improve the measurement accuracy of the drain current of the main MOS.

Further, according to present embodiment, the sense circuit source wiring SSW11 to SSW13 extends to a region opposite to the sense circuit source electrode SSF across the sense circuit region SA, the sense circuit source wiring SSW21 to SSW23 is connected to the sense circuit source wiring SSW11 to SSW13 in a region opposite to the sense circuit source electrode SSF across the sense circuit region SA.

According to this configuration, it is possible to move away the sense circuit source wiring SSW21 to SSW23 from the current path of the sense MOS, it is possible to further suppress the current flowing through the sense circuit source wiring SSW21 to SSW23.

Third Embodiment

Figure 34:
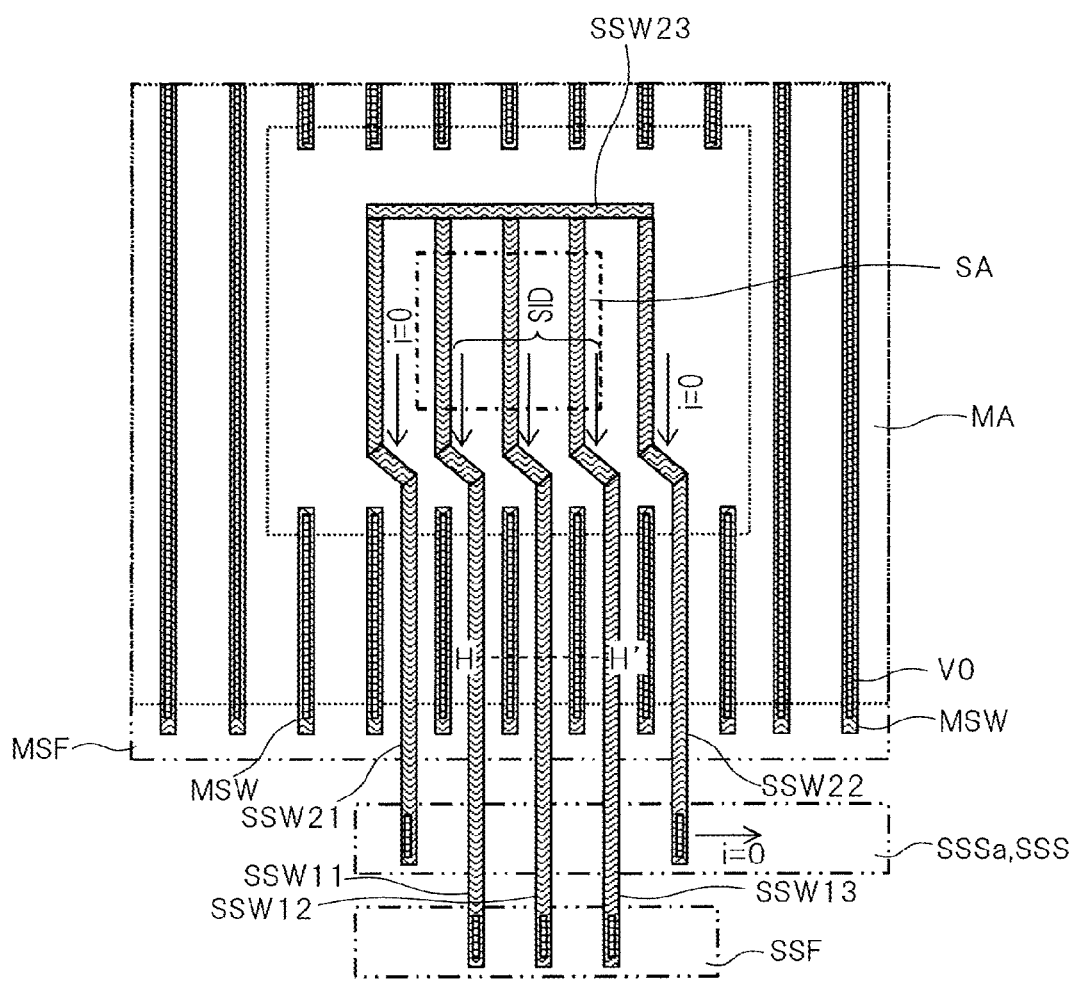
FIG. 34 is an enlarged main portion view of a semiconductor device according to third embodiment of the present invention.
Figure 35:
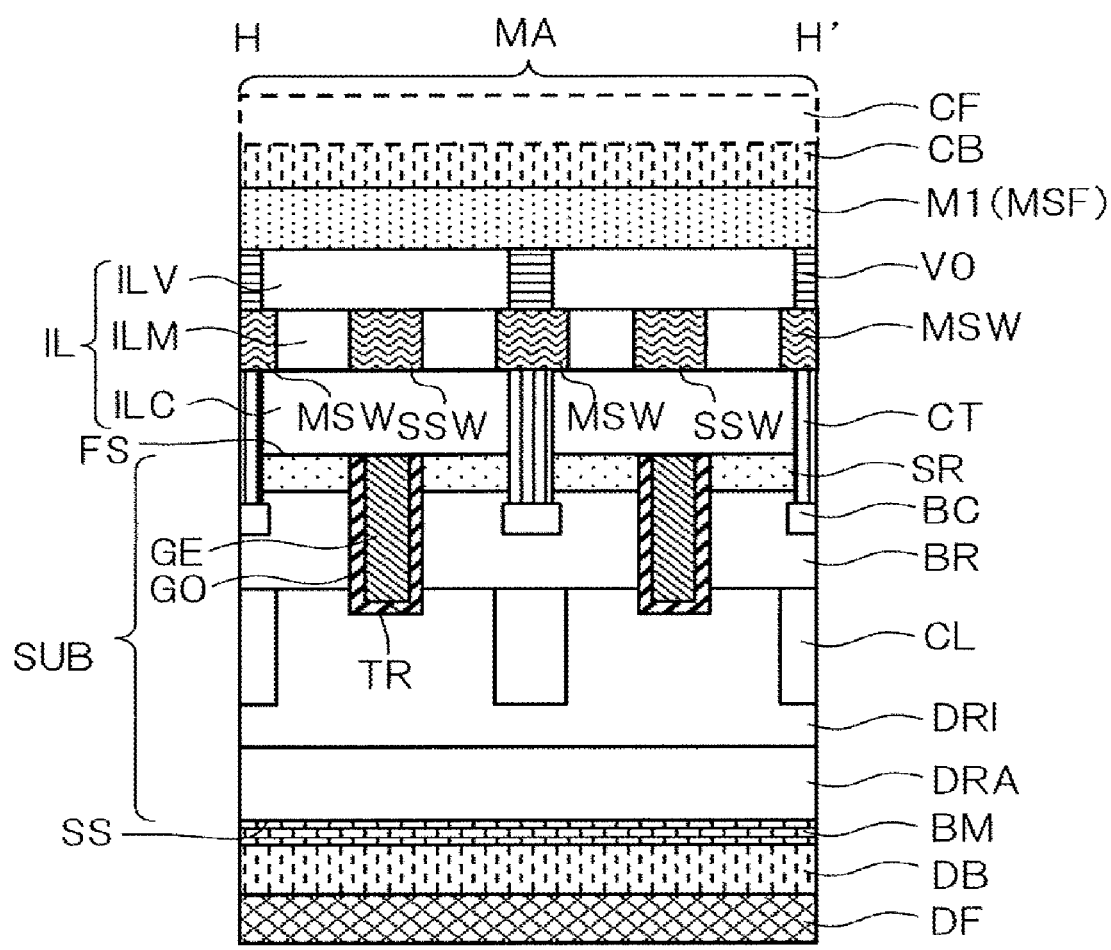
FIG. 35 is H-H' sectional view of FIG. 34.

Next, third embodiment will be described. FIG. 34 is an enlarged main portion view of a semiconductor device according to third embodiment of the present invention. FIG. 34 is similar to FIG. 33, the region including the sense circuit region SA and the sense circuit source electrode SSF or the like in a plan view is enlarged and displayed. FIG. 35 is H-H' sectional view of FIG. 34.

As shown in FIG. 34, present embodiment, the region between the sense circuit region SA and the sense circuit source electrode SSF (or the sense circuit source Kelvin electrode SSS) is provided with a sense circuit source wiring SSW and the main circuit source wiring MSW. That is, this region also has a main circuit region MA in which the main MOS can operate. Thus, in present embodiment, the sense circuit region SA is in a state surrounded by the main circuit region MA.

In the main circuit region MA between the sense circuit region SA and the sense circuit source electrode SSF, a plurality of main circuit source wiring MSW extending in the first direction is provided. Further, these main circuit source wiring MSW is also arranged at a predetermined pitch in the second direction.

In the main circuit region MA between the sense circuit region SA and the sense circuit source electrode SSF, as shown in FIGS. 34 and 35, the sense circuit source wiring SSW and the main circuit source wiring MSW are alternately arranged.

In FIG. 34, the sense circuit source wiring SSW vicinity the sense circuit region SA is disposed on the extension line of the main circuit source wiring MSF. In other words, the sense circuit source wiring SSW near the sense circuit region SA is disposed on the same grid as the main circuit source wiring MSW. For this reason, the sense circuit source wiring SSW is provided so as to extend the main circuit region MA after the grid is changed in an oblique direction immediately before entering the main circuit region MA from the sense circuit region SA. However, the sense circuit source wiring SSW near the sense circuit region SA may not be disposed on the same grid as the main circuit source wiring MSF. In this case, it is possible to place the sense circuit source wiring SSW without bending the wiring in the oblique direction. Thus, the wiring resistance is suppressed.

According to present embodiment, the sense circuit region SA is surrounded by the main circuit region MA, the main circuit source wiring MSW provided in the main circuit region MA between the sense circuit source electrode SSF and the sense circuit region SA extends in the same direction as the sense circuit source wiring SSW. According to this configuration, it is possible to provide the main circuit region MA between the sense circuit region SA and the sense circuit source electrode SSF, it is possible to effectively utilize the element region ER.

Further, according to present embodiment, when the sense circuit source wiring SSW is disposed on the same grid as the main circuit source wiring MSW, the sense circuit source wiring SSW is provided so as to extend the main circuit region MA after the grid is changed in an oblique direction immediately before entering the main circuit region MA from the sense circuit region SA. According to this configuration, it is possible to freely provide the sense circuit source wiring SSW in the main circuit region MA, it is possible to effectively utilize the element region ER.

Fourth Embodiment

Figure 36:
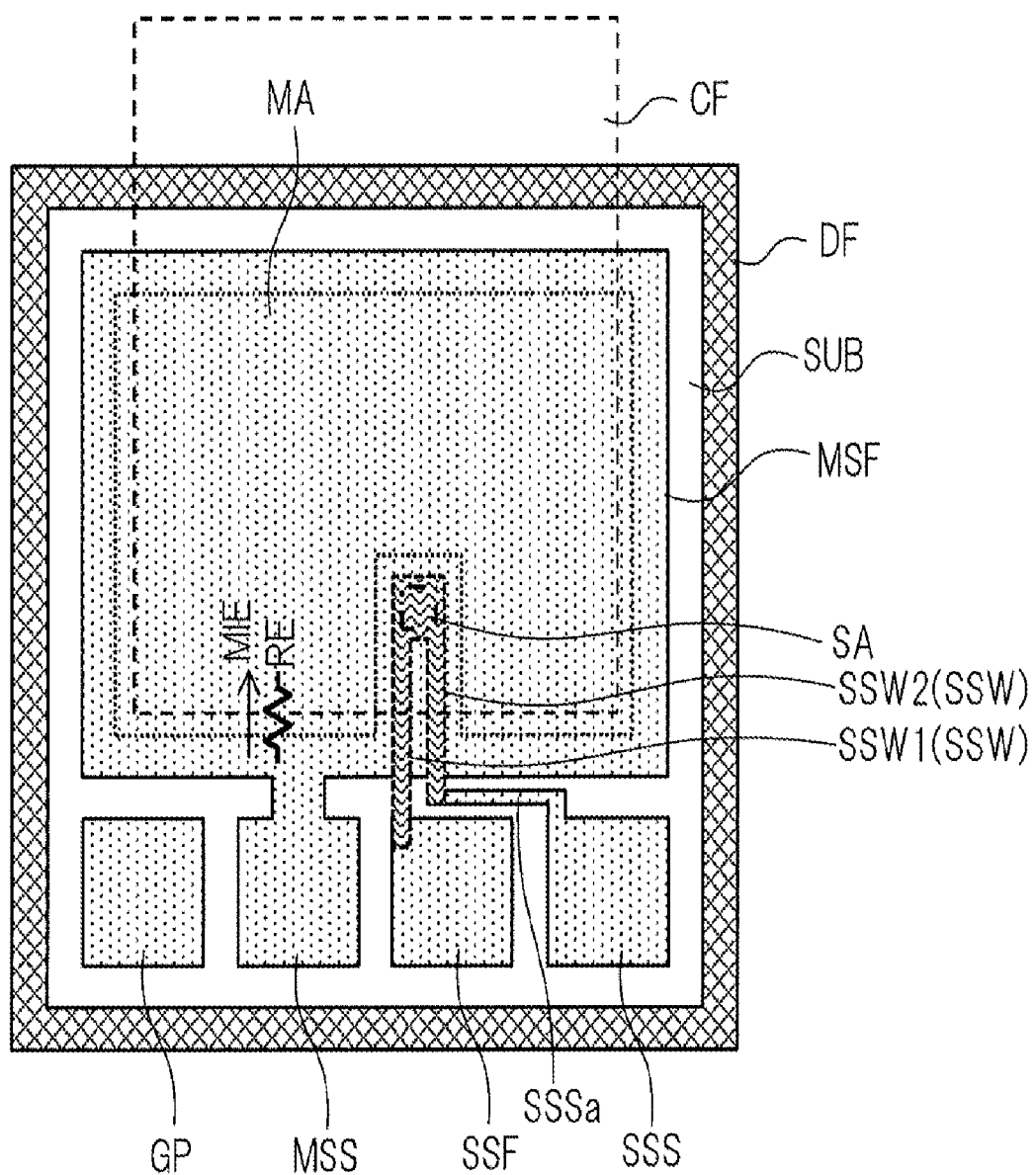
FIG. 36 is a diagram illustrating a problem related to the present inventive fourth embodiment.

Next, fourth embodiment will be described. FIG. 36 is a diagram illustrating a problem related to the present inventive fourth embodiment; FIG. 36 is based on FIG. 2, in which the matters necessary for the explanation of the problem are added to FIG. 2.

In the previous embodiments, as shown in FIGS. 2 and 36, the main circuit source electrode MSF and the main circuit source Kelvin electrode MSS were directly connected. In this configuration, the drain current of the main MOS includes not only vertical components but also components of the drain current MIE flowing from the main MOS outside the clip or bonding (not shown). The drain current MIE is a current component flowing horizontally the main circuit source electrode MSF.

Then, in the main circuit source electrode MSF, a voltage drop due to the parasitic resistor RE occurs. At this time, the source Kelvin voltage of the main MOS is measured higher than the actual source voltage by the amount of Voffset=MIE×RE. Consequently, the drain-to-source voltage of the sense MOS is controlled to be less than the drain-to-source voltage of the main MOS by a Voffset amount. Thus, since the drain current SID flowing through the sense MOS is less than the original current, the sense ratio is deviated from the set value. Further, since the parasitic resistance RE of the source electrode MSF for the main circuit has a temperature dependence, so that the amount of deviation of the sense ratio also has a temperature dependence.

Figure 37:
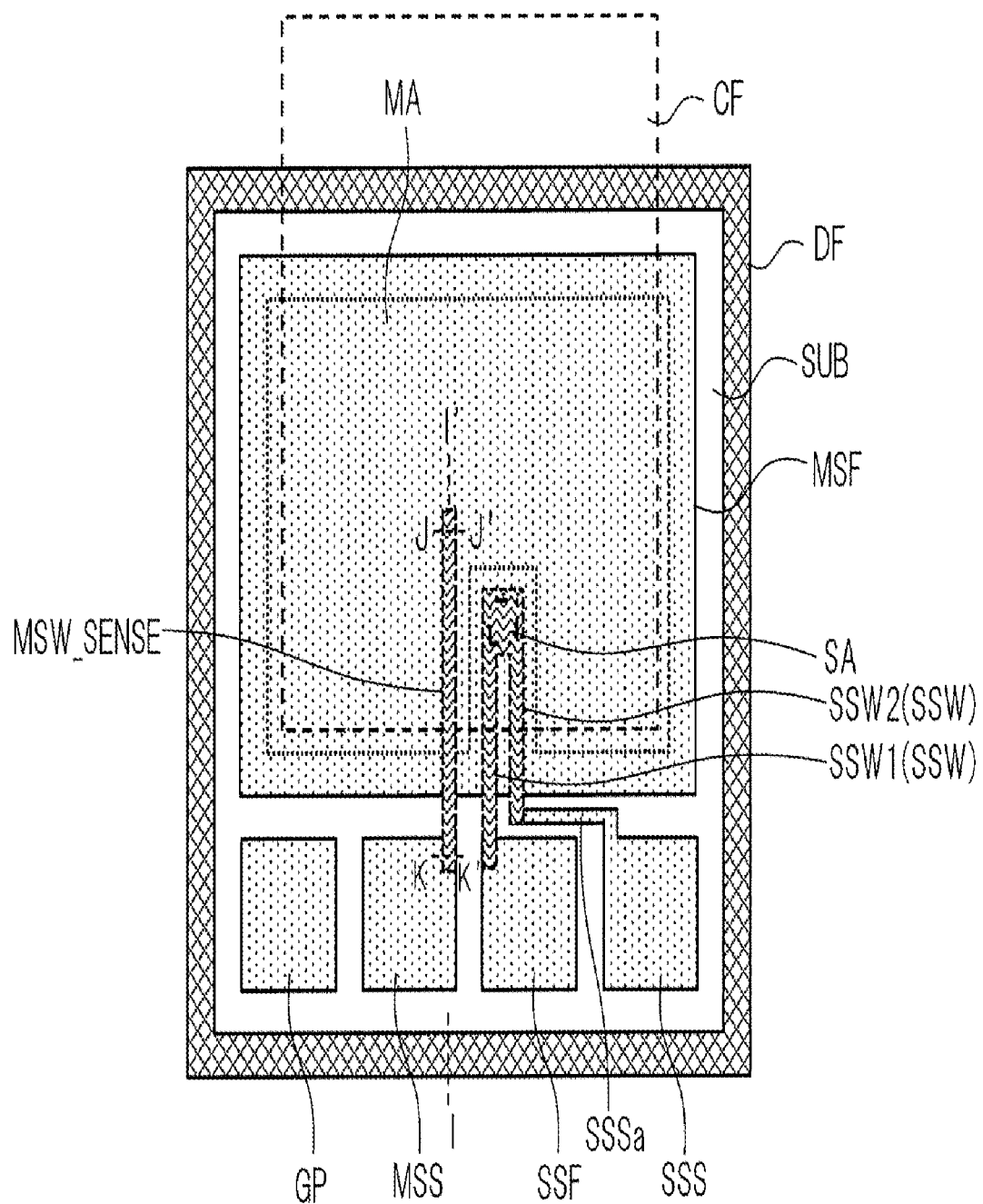
FIG. 37 is a plan view schematically illustrating an exemplary configuration of a semiconductor device according to fourth embodiment of the present invention.
Figure 38:
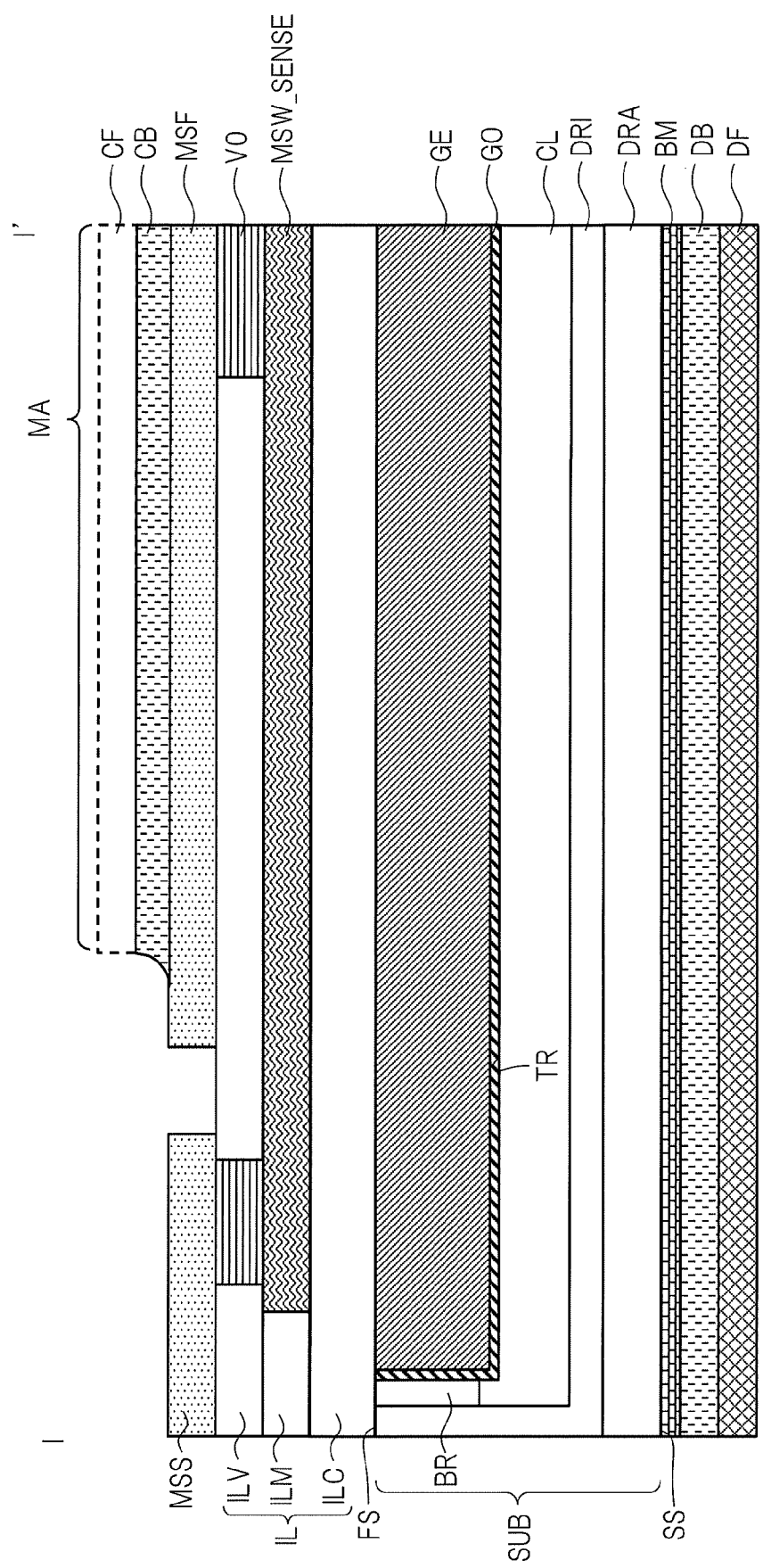
FIG. 38 is I-I' sectional view of FIG. 37.
Figure 39:
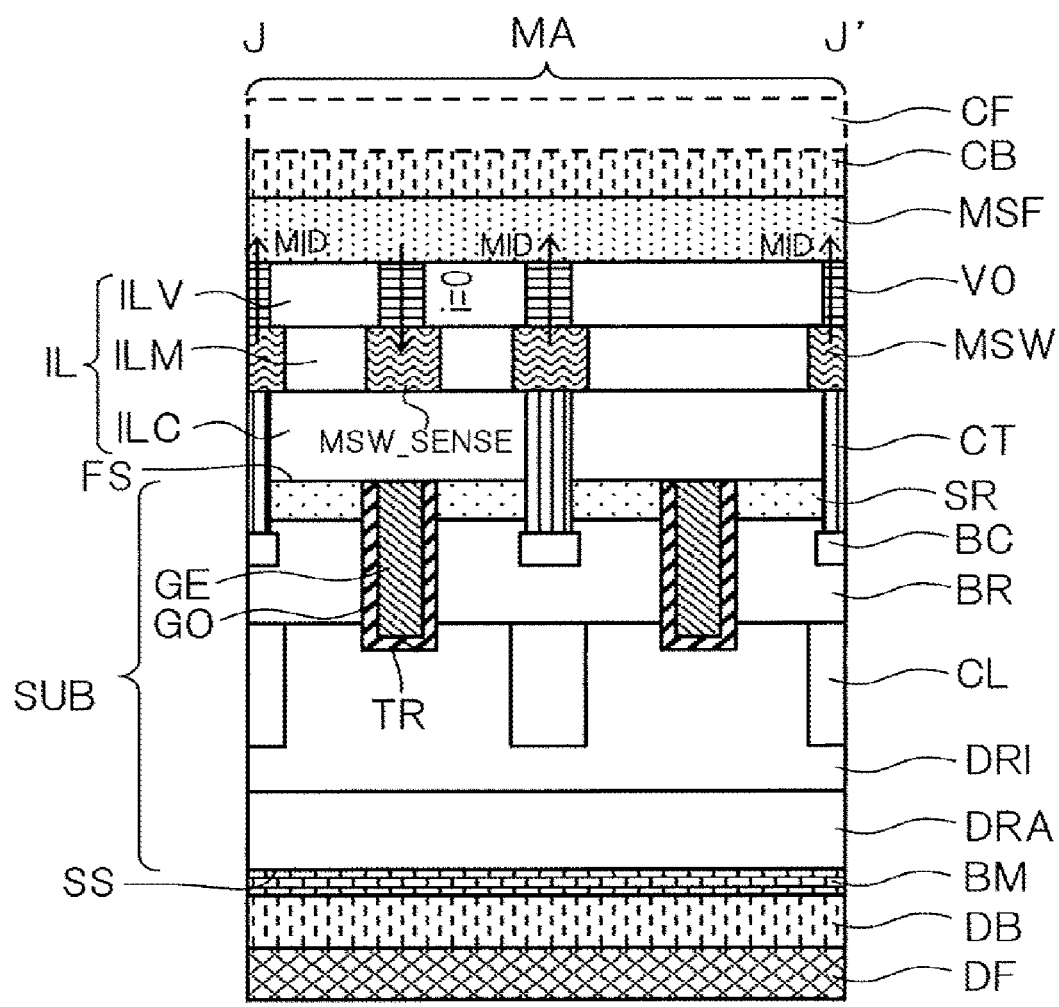
FIG. 39 is J-J' sectional view of FIG. 37.
Figure 40:
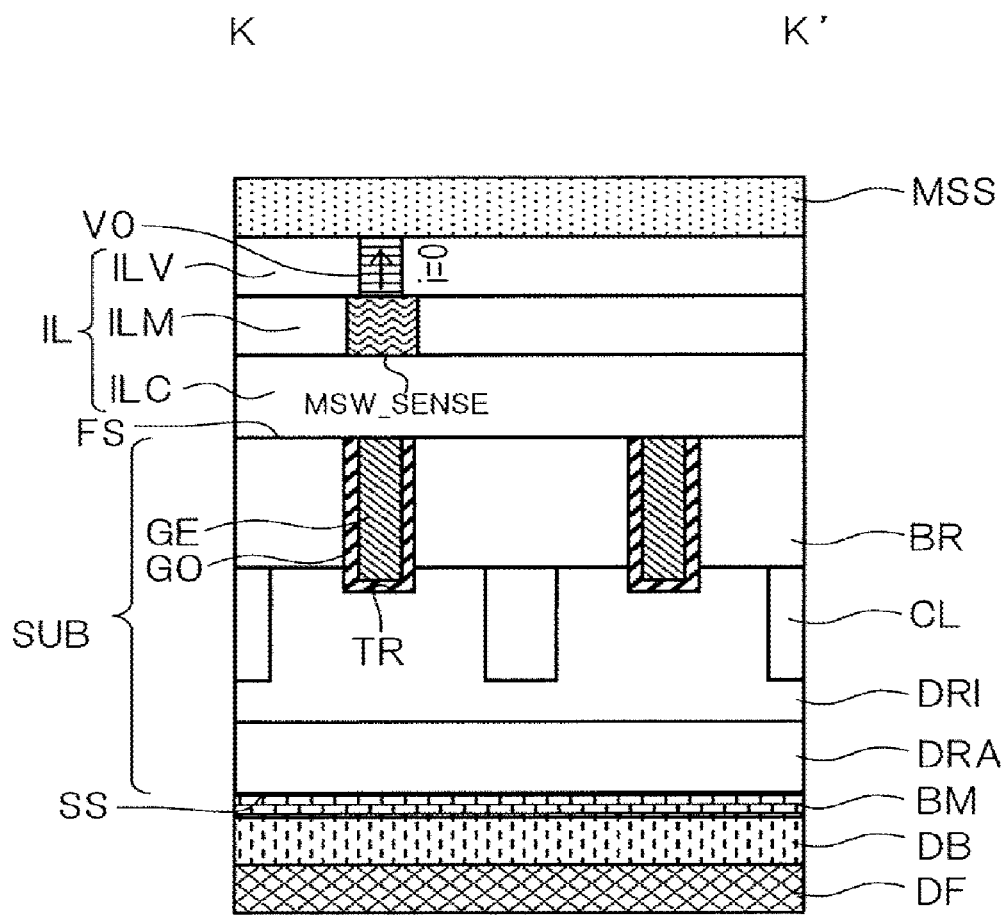
FIG. 40 is K-K' sectional view of FIG. 37.

Therefore, in present embodiment, the main circuit source electrode MSF and the main circuit source Kelvin electrode MSS are prevented from being directly connected. FIG. 37 is a plan view schematically illustrating an exemplary configuration of a semiconductor device according to fourth embodiment of the present invention. FIG. 38 is I-I' sectional view of FIG. 37. FIG. 39 is J-J' sectional view of FIG. 37. FIG. 40 is K-K' sectional view of FIG. 37.

As shown in FIGS. 37 to 40, the main circuit source electrode MSF and the main circuit source Kelvin electrode MSS are electrically connected via a wiring MSW SENSE which is the source electrode for the main circuit to the source Kelvin electrode interconnect for the main circuit. As shown in FIGS. 37 to 40, the wiring MSW SENSE is provided in the same layer as the main circuit source wiring MSW and the source wiring SSW for the sense circuit. The wiring MSW SENSE is connected to the main circuit source electrode MSF and the main circuit source Kelvin electrode MSS via the lower via V0. That is, the main circuit source electrode MSF will be connected to the wiring MSW SENSE on the surface opposite to the clip surface or the bonding surface.

According to this embodiment, the main circuit source Kelvin electrode MSS is connected to the main circuit source electrode MSF via the main circuit source electrode main circuit source Kelvin electrode wire provided on the lower layer of the main circuit source electrode MSF (MSW SENSE).

According to this configuration, since the main circuit source electrode MSF and the main circuit source Kelvin electrode MSS is not directly connected, it is possible to reduce the parasitic resistance in the main circuit source electrode MSF. Thus, it is possible to reduce the horizontal current component flowing through the main circuit source electrode MSF. Thus, by clipping or bonding, in a state where the resistor of the source electrode MSF for the main circuit is sufficiently reduced, it is possible to draw the potential of the main circuit source electrode MSF to the main circuit source Kelvin electrode MSS.

Further, since the drain current of the sense MOS is close to the original current, it is possible to reduce the amount of deviation from the set value of the sense ratio. Further, since it is possible to reduce the parasitic resistance in the main circuit source electrode MSF, to reduce the temperature dependence of the parasitic resistance of the main circuit source electrode MSF, it is possible to reduce the temperature dependence of the displacement amount of the sense ratio. Thus, it is possible to improve the detection accuracy of the drain current MID of the main MOS.

Fifth Embodiment

Figure 41:
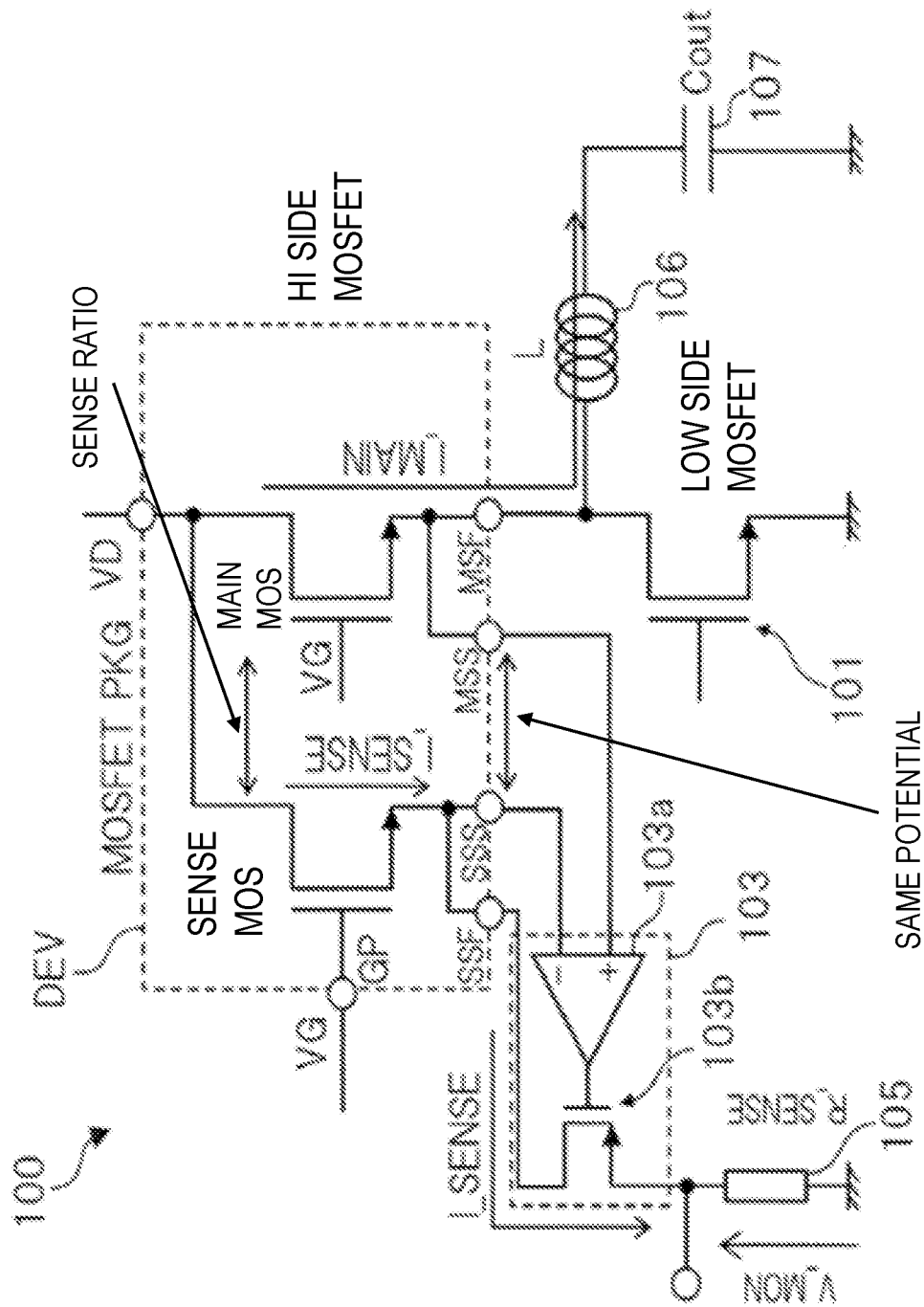
FIG. 41 is a schematic diagram illustrating an exemplary electronic device according to fifth embodiment of the present invention.

Fifth embodiment then describes the electronics with semiconductor device of first to fourth embodiments described so far. FIG. 41 is a schematic diagram illustrating an exemplary electronic device according to fifth embodiment of the present invention.

In FIG. 41, a DC-DC converter is shown as an example of an electronic device. DC-DC converters 100 power transistors are provided on each of the high side and low side. Of these, semiconductor device DEV in first to fourth embodiments is for the high side power transistors. Accordingly, DC-DC converter 100, semiconductor device DEV is a high side power transistor, the low side power transistor 101, the voltage control circuit 103, the shunt resistor 105, the output inductor 106, and an output capacitor 107 or the like. Each element provided in the path from the sense MOS to the shunt resistor 105 constitutes a current detection circuit.

Semiconductor device DEV includes a gate terminal which is connected to the gate electrode GP internally, a drain terminal which is connected to the die frame DF internally, and a source terminal for the main circuit which is connected to the clip frame CF or the main circuit source electrode MSF internally. Semiconductor device DEV also includes a source Kelvin terminal for the main circuit which is internally connected to the main circuit source Kelvin electrode MSS, a source terminal for the sense circuit which is internally connected to the sense circuit source electrode SSF, and a source Kelvin terminal for the sense circuit which is internally connected to the sense circuit source Kelvin electrode SSS.

Drain voltage VD is applied to the drain terminal of semiconductor device DEV from the outside. The drain voltage VD is supplied to the drain of the main MOS and the sense MOS in semiconductor device DEV through the drain terminal. Further, the gate terminal of semiconductor device DEV, the gate voltage VG is applied. The gate voltage VG is supplied to the gates of the main MOS and sense MOS in semiconductor device DEV through the gate terminal.

Low side power transistor 101 is constituted by, for example, a MOSFET. Semiconductor device DEV side of the low side power transistor 101 is connected to the source terminal for the main circuit. The other end of the low side power transistor 101 opposite semiconductor device DEV is grounded. Wiring connecting semiconductor device DEV and the low side power transistor 101 is connected to one end of the output inductor 106. The other end of the output inductor 106 is connected to one electrode of the output capacitor 107. The other electrode of the output capacitor 107 is grounded. From the main circuit source terminal of semiconductor device DEV, the current after being voltage-converted by semiconductor device DEV and the low side power transistor 101 is output as the main circuit current I_MAIN. This main circuit current I_MAIN corresponds to the drain current of the main MOS described in the foregoing embodiment.

The voltage control circuit 103 includes, for example, an operational amplifier 103a and a switching element 103b. The switching element 103b is constituted by, for example, MOSFET. The positive input terminal of the operational amplifier 103a is connected to the source terminal of the main MOS. The negative input terminal of the operational amplifier 103a is connected to the source terminal of the sense MOS. The output terminal of the operational amplifier is connected to the gate of the switching element 103b.

Semiconductor device DEV side of the switching element 103b is connected to the sense circuit source terminal. Semiconductor device DEV and the opposite side of the switching element 103b is connected to one end of the shunt resistor 105. The other end of the shunt resistor 105 is grounded.

The voltage control circuit 103 controls the gate voltage of the switching element 103b so that the main circuit source Kelvin electrode MSS (the source voltage of the main MOS) and the sense circuit source Kelvin electrode SSS (the source voltage of the sense MOS) are at the same potential based on the source voltages of the main MOS and the sense MOS supplied to each input terminal. Specifically, the switching element 103b, by flowing a predetermined sense circuit current I_SENSE corresponding to the gate voltage to the shunt resistor 105 side, to adjust the source voltage of the sense MOS. This sense circuit current I_SENSE corresponds to the drain current of the sense MOS described in the foregoing embodiment.

When the main circuit source Kelvin electrode MSS and the sense circuit source Kelvin electrode SSS are at the same potential, a state in which these are virtually short-circuited. Thus, the driving conditions of the main MOS and the sense MOS (e.g., gate-source voltage Vgs, drain-source voltage Vds) are equal to each other. Current ratio between the main circuit current I_MAIN and the sense circuit current I_SENSE at this time is a pre-designed sense ratio. In this state, by measuring the voltage breakdown amount V_MON using the shunt resistor 105 (resistance value R_SENSE), it is possible to measure the sense circuit current I_SENSE (=V_MON/R_SENSE). Then, it is possible to measure the main circuit current I_MAIN (=sense ratio×I_SENSE) by multiplying the sense ratio to the measured sense circuit current I_SENSE.

Although semiconductor device DEV has been applied to DC-DC converters, semiconductor device DEV can be applied to other electronic devices requiring current measurements.

According to present embodiment, device to achieve the respective effects in the above described embodiment is obtained. That is, it is possible to effectively utilize the chip area, it is possible to improve the accuracy of the current measurement.

Although the invention made by the present inventor has been specifically described based on the embodiment, the present invention is not limited to the embodiment described above, and it is needless to say that various modifications can be made without departing from the gist thereof.

Hereinafter, the preferred form of the present invention additional statement.

Supplementary Note 1

A semiconductor device including:
an element region in which the semiconductor element is provided, semiconductor substrate including an outer peripheral region surrounding the element region,
a plurality of semiconductor elements provided in an array in the element region,
a Source Kelvin electrode for the main circuit provided in the outer peripheral region,
the element region includes a main circuit region in which the main circuit of semiconductor device is formed, and a sense circuit region in which a sense circuit for measuring the drain current flowing through the semiconductor element of the main circuit region is formed,
the semiconductor element of the sense circuit region is surrounded by another said semiconductor element,
the main circuit source Kelvin electrode is an electrode for measuring the source potential of the semiconductor element of the main circuit region,
the main circuit source Kelvin electrode, the main circuit source electrode provided on the lower layer of the main circuit source electrode connected to the semiconductor element of the main circuit region is connected to the main circuit source electrode through the main circuit source Kelvin electrode wire.

What is claimed is:

1. A semiconductor device comprising:
an element region in which the semiconductor element is provided,
a semiconductor substrate including an outer peripheral region surrounding the element region,
a plurality of semiconductor elements provided in an array in the element region,
wherein the element region includes a main circuit region in which the main circuit of semiconductor device is formed,
wherein a sense circuit region in which a sense circuit for measuring the drain current flowing through the semiconductor element of the main circuit region is formed,
wherein the semiconductor element of the sense circuit region is surrounded by another said semiconductor element,
wherein the sense circuit region is covered with the main circuit source electrode connected to the semiconductor element of the main circuit region.

2. The semiconductor device according to claim 1,
wherein the outer peripheral region, the sense circuit source electrode connected to the semiconductor element of the sense circuit region is provided,
wherein the semiconductor element of the sense circuit region, the sense circuit source wiring for connecting the sense circuit source electrode is provided on the lower layer of the main circuit source electrode.

3. The semiconductor device according to claim 2,
wherein the main circuit source electrode is connected to the semiconductor element of the main circuit region through the main circuit source wiring of the lower layer,
wherein the sense circuit source wiring is provided in the same layer as the main circuit source wiring.

4. The semiconductor device according to claim 3 further comprising:
a sense circuit source Kelvin electrode for the source potential measurement of the semiconductor element of the sense circuit region provided in the outer peripheral region, and
a plurality of the sense circuit source wiring,
wherein a part of the sense circuit source wiring is connected to the sense circuit source electrode,
wherein the other source wiring for the sense circuit is connected to the source Kelvin electrode for the sense circuit.

5. The semiconductor device according to claim 4,
wherein the sense circuit source wiring connected to the sense circuit source electrode extends to a region opposite to the sense circuit source electrode across the sense circuit region,
wherein the sense circuit source wiring connected to the sense circuit source Kelvin electrode is connected to the sense circuit source wiring connected to the sense circuit source electrode in the region opposite to the sense circuit source electrode across the sense circuit region.

6. The semiconductor device according to claim 3,
wherein the sense circuit region is surrounded by the main circuit region,
wherein the main circuit source wiring provided in the main circuit region between the sense circuit source electrode and the sense circuit region extends in the same direction as the sense circuit source wiring.

7. The semiconductor device according to claim 6,
wherein the source wiring for the sense circuit is disposed on the same grid as the main circuit source wiring, and is provided so as to extend the main circuit region after the grid is changed in an oblique direction immediately before entering the main circuit region from the sense circuit region.

8. The semiconductor device according to claim 1 further comprising:
a source Kelvin electrode for a main circuit for source potential measurement of the semiconductor element of the main circuit region provided in the outer peripheral region,
wherein the main circuit source Kelvin electrode is connected to the main circuit source electrode via the main circuit source electrode—the main circuit source Kelvin electrode wire provided on the lower layer of the main circuit source electrode.

9. An electronic device comprising the semiconductor device according to claim 1.

10. The electronic device according to claim 9 is DC-DC converter.

\* \* \* \* \*